United States Patent
Schnell et al.

(10) Patent No.: US 11,462,226 B2
(45) Date of Patent: Oct. 4, 2022

(54) CONTROLLING BANDWIDTH IN ENCODERS AND/OR DECODERS

(71) Applicant: Fraunhofer-Gesellschaft zur Förderung der angewandten Forschung e.V., Munich (DE)

(72) Inventors: Markus Schnell, Nuremberg (DE); Emmanuel Ravelli, Erlangen (DE); Conrad Benndorf, Nuremberg (DE); Tobias Albert, Rödelsee (DE); Manfred Lutzky, Nuremberg (DE); Adrian Tomasek, Zirndorf (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/866,280

(22) Filed: May 4, 2020

(65) Prior Publication Data
US 2020/0265852 A1    Aug. 20, 2020

Related U.S. Application Data

(63) Continuation of application No. PCT/EP2018/080335, filed on Nov. 6, 2018.

(30) Foreign Application Priority Data

Nov. 10, 2017   (EP) .................................. 17201082

(51) Int. Cl.
*G10L 19/06*    (2013.01)
*G10L 19/02*    (2013.01)
(Continued)

(52) U.S. Cl.
CPC .......... *G10L 19/06* (2013.01); *G10L 19/0204* (2013.01); *G10L 19/035* (2013.01);
(Continued)

(58) Field of Classification Search
None
See application file for complete search history.

(56) References Cited

U.S. PATENT DOCUMENTS

| 4,972,484 A | 11/1990 | Link et al. |
| 5,012,517 A | 4/1991 | Chhatwal et al. |
| (Continued) | | |

FOREIGN PATENT DOCUMENTS

| CN | 101140759 A | 3/2008 |
| CN | 102779526 A | 11/2012 |
| (Continued) | | |

OTHER PUBLICATIONS

Dietz, Martin, et al. "Overview of the EVS codec architecture." 2015 IEEE International Conference on Acoustics, Speech and Signal Processing (ICASSP). IEEE, 2015. (Year: 2015).*
(Continued)

*Primary Examiner* — Douglas Godbold
(74) *Attorney, Agent, or Firm* — Novick, Kim & Lee, PLLC; Jae Youn Kim; Jihun Kim

(57) ABSTRACT

There are disclosed apparatus and methods for encoding and/or decoding information signals (e.g., audio signals). An encoder apparatus includes a plurality of frequency domain (FD) encoder tools for encoding an information signal, and an encoder bandwidth detector and controller configured to select a bandwidth for at least a subgroup of the FD encoder tools. The subgroup includes less FD encoder tools than the plurality of FD encoder tools. The selection is based on information signal characteristics, so that one of the FD encoder tools of the subgroup has a different bandwidth with respect to at least one of the FD encoder tools which are not in the subgroup.

28 Claims, 11 Drawing Sheets

(51) Int. Cl.
  *G10L 19/035* (2013.01)
  *G10L 19/038* (2013.01)
  *G10L 19/26* (2013.01)
  *H03M 7/30* (2006.01)

(52) U.S. Cl.
  CPC ............ *G10L 19/038* (2013.01); *G10L 19/26* (2013.01); *H03M 7/3062* (2013.01); *H03M 7/3066* (2013.01); *H03M 7/6005* (2013.01); *H03M 7/6011* (2013.01)

(56) References Cited

U.S. PATENT DOCUMENTS

| | | | |
|---|---|---|---|
| 5,581,653 | A | 12/1996 | Todd |
| 5,651,091 | A | 7/1997 | Chen et al. |
| 5,781,888 | A | 7/1998 | Herre |
| 5,812,971 | A | 9/1998 | Herre |
| 5,819,209 | A | 10/1998 | Inoue |
| 5,909,663 | A | 6/1999 | Iijima et al. |
| 5,999,899 | A | 12/1999 | Robinson |
| 6,018,706 | A | 1/2000 | Huang et al. |
| 6,148,288 | A | 11/2000 | Park |
| 6,167,093 | A | 12/2000 | Tsutsui et al. |
| 6,507,814 | B1 | 1/2003 | Gao |
| 6,570,991 | B1 | 5/2003 | Scheirer et al. |
| 6,665,638 | B1 | 12/2003 | Kang et al. |
| 6,735,561 | B1 | 5/2004 | Johnston et al. |
| 7,009,533 | B1 | 3/2006 | Wegener |
| 7,302,396 | B1 | 11/2007 | Cooke |
| 7,353,168 | B2 | 4/2008 | Chen et al. |
| 7,395,209 | B1 | 7/2008 | Dokic et al. |
| 7,539,612 | B2 | 5/2009 | Chen et al. |
| 7,546,240 | B2 | 6/2009 | Wei-Ge et al. |
| 8,015,000 | B2 | 9/2011 | Chen et al. |
| 8,095,359 | B2 | 1/2012 | Boehm et al. |
| 8,280,538 | B2 | 10/2012 | Kim et al. |
| 8,473,301 | B2 | 6/2013 | Chen et al. |
| 8,543,389 | B2 | 9/2013 | Ragot et al. |
| 8,554,549 | B2 | 10/2013 | Oshikiri et al. |
| 8,612,240 | B2 | 12/2013 | Fuchs et al. |
| 8,682,681 | B2 | 3/2014 | Fuchs et al. |
| 8,738,385 | B2 | 5/2014 | Chen |
| 8,751,246 | B2 | 6/2014 | Bayer et al. |
| 8,847,795 | B2 | 9/2014 | Faure et al. |
| 8,891,775 | B2 | 11/2014 | Mundt et al. |
| 8,898,068 | B2 | 11/2014 | Fuchs et al. |
| 9,026,451 | B1 | 5/2015 | Kleijn et al. |
| 9,123,350 | B2 | 9/2015 | Zhao et al. |
| 9,489,961 | B2 | 11/2016 | Kovesi et al. |
| 9,595,262 | B2 | 3/2017 | Fuchs et al. |
| 10,296,959 | B1 | 5/2019 | Chernikhova et al. |
| 10,726,854 | B2 | 7/2020 | Ghido et al. |
| 2001/0026327 | A1 | 10/2001 | Schreiber et al. |
| 2003/0088408 | A1 | 5/2003 | Thyssen et al. |
| 2003/0101050 | A1 | 5/2003 | Vladimir et al. |
| 2004/0158462 | A1 | 8/2004 | Rutledge et al. |
| 2004/0162866 | A1 | 8/2004 | Malvar et al. |
| 2005/0010395 | A1 | 1/2005 | Chiu et al. |
| 2005/0015249 | A1 | 1/2005 | Wei-Ge et al. |
| 2005/0192799 | A1 | 9/2005 | Kim et al. |
| 2005/0246178 | A1 | 11/2005 | Fejzo |
| 2006/0288851 | A1 | 12/2006 | Naoki et al. |
| 2007/0033056 | A1 | 2/2007 | Groeschl et al. |
| 2007/0078646 | A1 | 4/2007 | Lei et al. |
| 2007/0118361 | A1 | 5/2007 | Sinha et al. |
| 2007/0118369 | A1 | 5/2007 | Chen |
| 2007/0124136 | A1 | 5/2007 | Den Brinker et al. |
| 2007/0127729 | A1 | 6/2007 | Breebaart et al. |
| 2007/0129940 | A1 | 6/2007 | Geyersberger et al. |
| 2007/0154031 | A1 | 7/2007 | Carlos et al. |
| 2007/0276656 | A1 | 11/2007 | Solbach et al. |
| 2008/0033718 | A1 | 2/2008 | Zopf et al. |
| 2008/0091418 | A1 | 4/2008 | Laaksonen et al. |
| 2008/0126086 | A1 | 5/2008 | Kandhadai et al. |
| 2008/0126096 | A1 | 5/2008 | Ki-Hyun et al. |
| 2009/0076805 | A1 | 3/2009 | Zhengzhong et al. |
| 2009/0076830 | A1 | 3/2009 | Taleb |
| 2009/0089050 | A1 | 4/2009 | Mo et al. |
| 2009/0138267 | A1 | 5/2009 | Davidson et al. |
| 2009/0248424 | A1 | 10/2009 | Koishida et al. |
| 2009/0254352 | A1 | 10/2009 | Zhao |
| 2010/0010810 | A1 | 1/2010 | Morii |
| 2010/0070270 | A1 | 3/2010 | Gao |
| 2010/0094637 | A1 | 4/2010 | Vinton |
| 2010/0115370 | A1 | 5/2010 | Sakari et al. |
| 2010/0198588 | A1 | 8/2010 | Masataka et al. |
| 2010/0223061 | A1 | 9/2010 | Ojanpera |
| 2010/0312552 | A1 | 12/2010 | Kandhadai et al. |
| 2010/0312553 | A1 | 12/2010 | Fang et al. |
| 2010/0324912 | A1 | 12/2010 | Mi et al. |
| 2011/0015768 | A1 | 1/2011 | Soo et al. |
| 2011/0022924 | A1 | 1/2011 | Malenovsky et al. |
| 2011/0035212 | A1 | 2/2011 | Briand et al. |
| 2011/0060597 | A1 | 3/2011 | Wei-Ge et al. |
| 2011/0071839 | A1 | 3/2011 | Budnikov et al. |
| 2011/0095920 | A1 | 4/2011 | Ashley et al. |
| 2011/0096830 | A1 | 4/2011 | Ashley et al. |
| 2011/0116542 | A1 | 5/2011 | Marc et al. |
| 2011/0125505 | A1 | 5/2011 | Phillepe et al. |
| 2011/0145003 | A1 | 6/2011 | Bessette |
| 2011/0196673 | A1 | 8/2011 | Jin et al. |
| 2011/0200198 | A1 | 8/2011 | Stefan et al. |
| 2011/0238425 | A1 | 9/2011 | Jeremie et al. |
| 2011/0238426 | A1 | 9/2011 | Borsum et al. |
| 2012/0010879 | A1 | 1/2012 | Kei et al. |
| 2012/0022881 | A1 | 1/2012 | Geiger et al. |
| 2012/0072209 | A1 | 3/2012 | Krishnan et al. |
| 2012/0109659 | A1 | 5/2012 | Guoming et al. |
| 2012/0214544 | A1 | 8/2012 | Rodriguez et al. |
| 2012/0245947 | A1 | 9/2012 | Neuendorf et al. |
| 2012/0265540 | A1 | 10/2012 | Fuchs et al. |
| 2012/0265541 | A1 | 10/2012 | Geiger et al. |
| 2013/0030819 | A1 | 1/2013 | Pontus et al. |
| 2013/0096912 | A1 | 4/2013 | Resch et al. |
| 2013/0226594 | A1 | 8/2013 | Fuchs et al. |
| 2013/0282369 | A1 | 10/2013 | Sang-Ut et al. |
| 2014/0052439 | A1 | 2/2014 | Tejaswi et al. |
| 2014/0067404 | A1 | 3/2014 | Baumgarte |
| 2014/0074486 | A1 | 3/2014 | Martin et al. |
| 2014/0108020 | A1 | 4/2014 | Yang et al. |
| 2014/0142957 | A1 | 5/2014 | Nam-Suk et al. |
| 2014/0172141 | A1 | 6/2014 | Mangold |
| 2014/0223029 | A1 | 8/2014 | Bhaskar et al. |
| 2014/0358531 | A1 | 12/2014 | Vos |
| 2015/0010155 | A1 | 1/2015 | Yue et al. |
| 2015/0081312 | A1 | 3/2015 | Fuchs et al. |
| 2015/0142452 | A1 | 5/2015 | Nam-Suk et al. |
| 2015/0154969 | A1 | 6/2015 | Craven et al. |
| 2015/0162011 | A1 | 6/2015 | Zexin et al. |
| 2015/0170668 | A1 | 6/2015 | Kovesi et al. |
| 2015/0221311 | A1 | 8/2015 | Jeon et al. |
| 2015/0228287 | A1 | 8/2015 | Bruhn et al. |
| 2015/0255079 | A1 | 9/2015 | Huang et al. |
| 2015/0302859 | A1 | 10/2015 | Aguilar et al. |
| 2015/0302861 | A1 | 10/2015 | Salami et al. |
| 2015/0325246 | A1 | 11/2015 | Philip et al. |
| 2015/0371647 | A1 | 12/2015 | Faure et al. |
| 2016/0019898 | A1 | 1/2016 | Schreiner et al. |
| 2016/0027450 | A1 | 1/2016 | Gao |
| 2016/0078878 | A1 | 3/2016 | Ravelli et al. |
| 2016/0111094 | A1 | 4/2016 | Martin et al. |
| 2016/0163326 | A1 | 6/2016 | Resch et al. |
| 2016/0189721 | A1 | 6/2016 | Johnston et al. |
| 2016/0225384 | A1 | 8/2016 | Kristofer et al. |
| 2016/0285718 | A1 | 9/2016 | Bruhn |
| 2016/0293174 | A1* | 10/2016 | Atti .......................... G10L 19/26 |
| 2016/0293175 | A1 | 10/2016 | Atti et al. |
| 2016/0307576 | A1 | 10/2016 | Stefan et al. |
| 2016/0365097 | A1 | 12/2016 | Guan et al. |
| 2016/0372125 | A1 | 12/2016 | Atti et al. |
| 2016/0372126 | A1 | 12/2016 | Atti et al. |
| 2016/0379649 | A1 | 12/2016 | Lecomte et al. |
| 2016/0379655 | A1 | 12/2016 | Truman et al. |
| 2017/0011747 | A1 | 1/2017 | Faure et al. |

(56) References Cited

U.S. PATENT DOCUMENTS

| | | | |
|---|---|---|---|
| 2017/0053658 A1 | 2/2017 | Atti et al. | |
| 2017/0078794 A1 | 3/2017 | Bongiovi et al. | |
| 2017/0103769 A1* | 4/2017 | Laaksonen | G10L 19/008 |
| 2017/0110135 A1 | 4/2017 | Disch et al. | |
| 2017/0133029 A1 | 5/2017 | Markovic et al. | |
| 2017/0140769 A1 | 5/2017 | Ravelli et al. | |
| 2017/0154631 A1 | 6/2017 | Bayer et al. | |
| 2017/0154635 A1 | 6/2017 | Doehla et al. | |
| 2017/0221495 A1* | 8/2017 | Sung | G10L 19/12 |
| 2017/0236521 A1 | 8/2017 | Venkatraman et al. | |
| 2017/0249387 A1 | 8/2017 | Hatami-Hanza | |
| 2017/0256266 A1* | 9/2017 | Sung | G10L 19/0204 |
| 2017/0294196 A1 | 10/2017 | Bradley et al. | |
| 2017/0303114 A1* | 10/2017 | Johansson | H04L 65/607 |
| 2019/0027156 A1* | 1/2019 | Sung | G10L 19/22 |

FOREIGN PATENT DOCUMENTS

| | | |
|---|---|---|
| CN | 107103908 A | 8/2017 |
| EP | 0716787 A1 | 6/1996 |
| EP | 0732687 B2 | 9/1996 |
| EP | 1791115 A2 | 5/2007 |
| EP | 2676266 B1 | 12/2013 |
| EP | 2980796 A1 | 2/2016 |
| EP | 2980799 A1 | 2/2016 |
| EP | 3111624 A1 | 1/2017 |
| FR | 2944664 A1 | 10/2010 |
| JP | H05-281996 A | 10/1993 |
| JP | H07-28499 A | 1/1995 |
| JP | H0811644 A | 1/1996 |
| JP | H9-204197 A | 8/1997 |
| JP | H10-51313 A | 2/1998 |
| JP | H1091194 A | 4/1998 |
| JP | H11-330977 A | 11/1999 |
| JP | 2004-138756 A | 5/2004 |
| JP | 2006-527864 A | 12/2006 |
| JP | 2007519014 A | 7/2007 |
| JP | 2007-525718 A | 9/2007 |
| JP | 2009-003387 A | 1/2009 |
| JP | 2009-008836 A | 1/2009 |
| JP | 2009-538460 A | 11/2009 |
| JP | 2010-500631 A | 1/2010 |
| JP | 2010-501955 A | 1/2010 |
| JP | 2012-533094 A | 12/2012 |
| JP | 2016-523380 A | 8/2016 |
| JP | 2016-200750 A | 12/2016 |
| JP | 2017-522604 A | 8/2017 |
| JP | 2017-528752 A | 9/2017 |
| KR | 100261253 B1 | 7/2000 |
| KR | 20030031936 A | 4/2003 |
| KR | 1020050007853 A | 1/2005 |
| KR | 1020090077951 A | 7/2009 |
| KR | 10-2010-0136890 A | 12/2010 |
| KR | 20130019004 A | 2/2013 |
| KR | 10-2016-0079056 A | 7/2016 |
| KR | 1020160144978 A | 12/2016 |
| KR | 20170000933 A | 1/2017 |
| RU | 2337414 C2 | 10/2008 |
| RU | 2376657 C2 | 12/2009 |
| RU | 2413312 C2 | 2/2011 |
| RU | 2419891 C2 | 5/2011 |
| RU | 2439718 C1 | 1/2012 |
| RU | 2483365 C2 | 5/2013 |
| RU | 2520402 C2 | 6/2014 |
| RU | 2568381 C2 | 11/2015 |
| RU | 2596594 C2 | 9/2016 |
| RU | 2596596 C2 | 9/2016 |
| RU | 2015136540 A | 3/2017 |
| RU | 2628162 C2 | 8/2017 |
| RU | 2016105619 A | 8/2017 |
| TW | 200809770 A | 2/2008 |
| TW | 201005730 A | 2/2010 |
| TW | 201126510 A | 8/2011 |
| TW | 201131550 A | 9/2011 |
| TW | 201207839 A | 2/2012 |
| TW | 201243832 A | 11/2012 |
| TW | 201612896 A | 4/2016 |
| TW | 201618080 A | 5/2016 |
| TW | 201618086 A | 5/2016 |
| TW | 201642246 A | 12/2016 |
| TW | 201642247 A | 12/2016 |
| TW | 201705126 A | 2/2017 |
| TW | 201711021 A | 3/2017 |
| TW | 201713061 A | 4/2017 |
| TW | 201724085 A | 7/2017 |
| TW | 201732779 A | 9/2017 |
| WO | 9916050 A1 | 4/1999 |
| WO | 2004/072951 A1 | 8/2004 |
| WO | 2005/086138 A1 | 9/2005 |
| WO | 2005/086139 A1 | 9/2005 |
| WO | 2007/073604 A1 | 7/2007 |
| WO | 2007/138511 A1 | 12/2007 |
| WO | 2008/025918 A1 | 3/2008 |
| WO | 2008/046505 A1 | 4/2008 |
| WO | 2009/066869 A1 | 5/2009 |
| WO | 2011/048118 A1 | 4/2011 |
| WO | 2011/086066 A1 | 7/2011 |
| WO | 2011/086067 A1 | 7/2011 |
| WO | 2012/000882 A | 1/2012 |
| WO | 2012/000882 A1 | 1/2012 |
| WO | 2012/126893 A | 9/2012 |
| WO | 2014/165668 A | 10/2014 |
| WO | 2014/202535 A | 12/2014 |
| WO | 2014/202535 A1 | 12/2014 |
| WO | 2015/063045 A1 | 5/2015 |
| WO | 2015/063227 A1 | 5/2015 |
| WO | 2015/071173 A1 | 5/2015 |
| WO | 2015/174911 A1 | 11/2015 |
| WO | 2016/016121 A1 | 2/2016 |
| WO | 2016/142002 A1 | 9/2016 |
| WO | 2016/142337 A1 | 9/2016 |

OTHER PUBLICATIONS

Tetsuyuki Okumachi, "Office Action for JP Application 2020-118837", dated Jul. 16, 2021, JPG, Japan.

Tetsuyuki Okumachi, "Office Action for JP Application 2020-118838", dated Jul. 16, 2021, JPO, Japan.

John Tan, "Office Action for SG Application 11202004173P", dated Jul. 23, 2021, IPOS, Singapore.

Guojun Lu et al., "A Technique towards Automatic Audio Classification and Retrieval, Forth International Conference on Signal Processing", 1998, IEEE, Oct. 12, 1998, pp. 1142 to 1145.

Hiroshi Ono, "Office Action for JP Application No. 2020-526135", dated May 21, 2021, JPO Japan.

"Decision on Grant Patent for Invention for RU Application No. 2020118949", dated Nov. 11, 2020, Rospatent, Russia.

Takeshi Yamashita, "Office Action for JP Application 2020-524877", dated Jun. 24, 2021, JPO, Japan.

P.A. Volkov, "Office Action for RU Application No. 2020120251", dated Oct. 28, 2020, Rospatent, Russia.

P.A. Volkov, "Office Action for RU Application No. 2020120256", dated Oct. 28, 2020, Rospatent, Russia.

D.V.Travnikov, "Decision on Grant for RU Application No. 2020118969", dated Nov. 2, 2020, Rospatent, Russia.

Lakshmi Narayana Chinta, "Office Action for IN Application No. 202037018098", dated Jul. 13, 2021, Intellectual Property India, India.

ETSI TS 126 445 V13.2.0 (Aug. 2016), Universal Mobile Telecommunications System (UMTS); LTE; Codec for Enhanced Voice Services (EVS); Detailed algorithmic description (3GPP TS 26.445 version 13.2.0 Release 13) [Online]. Available: http://www.3gpp.org/ftp/Specs/archive/26_series/26.445/26445-d00.zip.

Geiger, "Audio Coding based on integer transform", Ilmenau: https://www.db-thueringen.de/receive/dbt_mods_00010054, 2004.

Henrique S Malvar, "Biorthogonal and Nonuniform Lapped Transforms for Transform Coding with Reduced Blocking and Ringing Artifacts", IEEE Transactions on Signal Processing, IEEE Service Center, New York, NY, US, (Apr. 1998), vol. 46, No. 4, ISSN 1053-587X, XP011058114.

(56) References Cited

OTHER PUBLICATIONS

Anonymous, "ISO/IEC 14496-3:2005/FDAM 9, AAC-ELD", 82. MPEG Meeting;Oct. 22, 2007-Oct. 26, 2007; Shenzhen; (Motion Picture Expert Group or ISO/IEC JTC1/SC29/WG11)., (Feb. 21, 2008), No. N9499, XP030015994.

Virette, "Low Delay Transform for High Quality Low Delay Audio Coding", Université de Rennes 1, (Dec. 10, 2012), pp. 1-195, URL: https://hal.inria.fr/tel-01205574/document, (Mar. 30, 2016), XP055261425.

ISO/IEC 14496-3:2001; Information technology—Coding of audio-visual objects—Part 3: Audio.

3GPP TS 26.403 v14.0.0 (Mar. 2017); General audio codec audio processing functions; Enhanced acPlus general audio codec; Encoder specification; Advanced Audio Coding (AAC) part; (Release 14).

ISO/IEC 23003-3; Information technology—MPEG audio technologies—Part 3: Unified speech and audio coding, 2011.

3GPP TS 26.445 V14.1.0 (Jun. 2017), 3rd Generation Partnership Project; Technical Specification Group Services and System Aspects; Codec for Enhanced Voice Services (EVS); Detailed Algorithmic Description (Release 14), http://www.3gpp.org/ftp//Specs/archive/26_series/26.445/26445-e10.zip, Section 5.1.6 "Bandwidth detection".

Eksler Vaclav et al, "Audio bandwidth detection in the EVS codec", 2015 IEEE Global Conference on Signal and Information Processing (GLOBALSIP), IEEE, (Dec. 14, 2015), doi:10.1109/GLOBALSIP. 2015.7418243, pp. 488-492, XP032871707.

Oger M et al, "Transform Audio Coding with Arithmetic-Coded Scalar Quantization and Model-Based Bit Allocation", International Conference on Acoustics, Speech, and Signalprocessing, IEEE, XX, Apr. 15, 2007 (Apr. 15, 2007), page IV-545, XP002464925.

Asad et al., "An enhanced least significant bit modification technique for audio steganography", International Conference on Computer Networks and Information Technology, Jul. 11-13, 2011.

Makandar et al, "Least Significant Bit Coding Analysis for Audio Steganography", Journal of Future Generation Computing, vol. 2, No. 3, Mar. 2018.

ISO/IEC 23008-3:2015; Information technology—High efficiency coding and media delivery in heterogeneous environments—Part 3: 3D audio.

ITU-T G.718 (Jun. 2008): Series G: Transmission Systems and Media, Digital Systems and Networks, Digital terminal equipments—Coding of voice and audio signals, Frame error robust narrow-band and wideband embedded variable bit-rate coding of speech and audio from 8-32 kbit/s.

3GPP TS 26.447 V14.1.0 (Jun. 2017), Technical Specification, 3rd Generation Partnership Project; Technical Specification Group Services and System Aspects; Codec for Enhanced Voice Services (EVS); Error Concealment of Lost Packets (Release 14).

DVB Organization, "ISO-IEC 23008-3_A3_(E)_(H 3DA FDAM3). docx", DVB, Digital Video Broadcasting, C/O EBI—17A Ancienne Route—CH-1218 Grand Saconnex, Geneva—Switzerland, (Jun. 13, 2016), XP017851888.

Hill et al., "Exponential stability of time-varying linear systems," IMA J Numer Anal, pp. 865-885, 2011.

3GPP TS 26.090 V14.0.0 (Mar. 2017), 3rd Generation Partnership Project; Technical Specification Group Services and System Aspects; Mandatory Speech Codec speech processing functions; Adaptive Multi-Rate (AMR) speech codec; Transcoding functions (Release 14).

3GPP TS 26.190 V14.0.0 (Mar. 2017), Technical Specification, 3rd Generation Partnership Project; Technical Specification Group Services and System Aspects; Speech codec speech processing functions; Adaptive Multi-Rate—Wideband (AMR-WB) speech codec; Transcoding functions (Release 14).

3GPP TS 26.290 V14.0.0 (Mar. 2017), Technical Specification, 3rd Generation Partnership Project; Technical Specification Group Services and System Aspects; Audio codec processing functions; Extended Adaptive Multi-Rate—Wideband (AMR-WB+) codec; Transcoding functions (Release 14).

Edler et al., "Perceptual Audio Coding Using a Time-Varying Linear Pre- and Post-Filter," in AES 109th Convention, Los Angeles, 2000.

Gray et al., "Digital lattice and ladder filter synthesis," IEEE Transactions on Audio and Electroacoustics, vol. vol. 21, No. No. 6, pp. 491-500, 1973.

Lamoureux et al., "Stability of time variant filters," CREWES Research Report—vol. 19, 2007.

Herre et al., "Enhancing the performance of perceptual audio coders by using temporal noise shaping (TNS)." Audio Engineering Society Convention 101. Audio Engineering Society, 1996.

Herre et al., "Continuously signal-adaptive filterbank for high-quality perceptual audio coding." Applications of Signal Processing to Audio and Acoustics, 1997. 1997 IEEE ASSP Workshop on. IEEE, 1997.

Herre, "Temporal noise shaping, quantization and coding methods in perceptual audio coding: A tutorial introduction." Audio Engineering Society Conference: 17th International Conference: High-Quality Audio Coding. Audio Engineering Society, 1999.

Fuchs Guillaume et al, "Low delay LPC and MDCT-based audio coding in the EVS codec", 2015 IEEE International Conference on Acoustics, Speech and Signal Processing (ICASSP), IEEE, (Apr. 19, 2015), doi: 10.1109/ICASSP.2015.7179068, pp. 5723-5727, XP033187858.

Niamut et al, "RD Optimal Temporal Noise Shaping for Transform Audio Coding", Acoustics, Speech and Signal Processing, 2006. ICASSP 2006 Proceedings. 2006 IEEE International Conference on Toulouse, France May 14-19, 2006, Piscataway, NJ, USA,IEEE, Piscataway, NJ, USA, (Jan. 1, 2006), doi:10.1109/ICASSP.2006. 1661244, ISBN 978-1-4244-0469-8, pages V-V, XP031015996.

ITU-T G.711 (Sep. 1999): Series G: Transmission Systems and Media, Digital Systems and Networks, Digital transmission systems—Terminal equipments—Coding of analogue signals by pulse code modulation, Pulse code modulation (PCM) of voice frequencies, Appendix I: A high quality low-complexity algorithm for packet loss concealment with G.711.

Cheveigne et al.,"YIN, a fundamental frequency estimator for speech and music." The Journal of the Acoustical Society of America 111.4 (2002): 1917-1930.

Ojala P et al, "A novel pitch-lag search method using adaptive weighting and median filtering", Speech Coding Proceedings, 1999 IEEE Workshop on Porvoo, Finland Jun. 20-23, 1999, Piscataway, NJ, USA, IEEE, US, (Jun. 20, 1999), doi:10.1109/SCFT.1999. 781502, ISBN 978-0-7803-5651-1, pp. 114-116, XP010345546.

"5 Functional description of the encoder", Dec. 10, 2014 (Dec. 10, 2014), 3GPP Standard; 26445-C10_1_S05_S0501, 3rd Generation Partnership Project (3GPP)?, Mobile Competence Centre ; 650, Route Des Lucioles ; F-06921 Sophia-Antipolis Cedex; France Retrieved from the Internet:URL http://www.3gpp.org/ftp/Specs/2014-12/Rel-12/26_series/ XP050907035.

Hiroshi Ono, "Office Action for JP Application No. 2020-526081", dated Jun. 22, 2021, JPO, Japan.

Hiroshi Ono, "Office Action for JP Application No. 2020-526084", dated Jun. 23, 2021, JPO, Japan.

Tomonori Kikuchi, "Office Action for JP Application No. 2020-524874", dated Jun. 2, 2021, JPO Japan.

O.E. Groshev, "Office Action for RU Application No. 2020118947", dated Dec. 1, 2020, Rospatent, Russia.

O.I. Starukhina, "Office Action for RU Application No. 2020118968", dated Dec. 23, 2020, Rospatent, Russia.

Sujoy Sarkar, "Examination Report for IN Application No. 202037018091", dated Jun. 1, 2021, Intellectual Property India, India.

Miao Xiaohong, "Examination Report for SG Application No. 11202004228V", dated Sep. 2, 2021, IPOS, Singapore.

Miao Xiaohong, "Search Report for SG Application No. 11202004228V", dated Sep. 3, 2021, IPOS, Singapore.

Nam Sook Lee, "Office Action for KR Application No. 10-2020-7015512", dated Sep. 9, 2021, KIPO, Republic of Korea.

Santosh Mehtry, "Office Action for IN Application No. 202037019203", dated Mar. 19, 2021, Intellectual Property India, India.

Khalid Sayood, "Introduction to Data Compression", Elsevier Science & Technology, 2005, Section 16.4, Figure 16. 13, p. 526.

(56) References Cited

OTHER PUBLICATIONS

Patterson et al., "Computer Organization and Design", The hardware/software Interface, Revised Fourth Edition, Elsevier, 2012.
Nam Sook Lee, "Office Action for KR Application No. 10-2020-7016424", dated Feb. 9, 2022, KIPO, Korea.
Nam Sook Lee, "Office Action for KR Application No. 10-2020-7016503", dated Feb. 9, 2022, KIPO, Korea.
International Telecommunication Union, "G. 729-based embedded variable bit-rate coder: An 8-32 kbit/s scalable wideband coder bitstream interoperable with G.729". ITU-T Recommendation G.729. 1., May 2006
3GGP TS 26.445, "Universal Mobile TElecommunications System (UMTS; LTE; Codec for Enhanced Voice Services (EVS); Detailed algorithmic description (3GPP TS 26.445 version 13.4.1 Release 13)", ETSI TS 126 445 V13.4.1., Apr. 2017.
Nam Sook Lee, "Office Action for KR Application No. 10-2020-7016100", dated Jan. 13, 2022, KIPO, Republic of Korea.
Nam Sook Lee, "Office Action for KR Application No. 10-2020-7016224", dated Jan. 13, 2022, KIPO, Republic of Korea.
Nam Sook Lee, "Office Action for KR Application No. 10-2020-7015835", dated Jan. 13, 2022, KIPO, Republic of Korea.
Kazunori Mochimura, "Decision to Grant a Patent for JP application No. 2020-524579", dated Nov. 29, 2021, JPO, Japan.
ETSI TS 126 445 V12.0.0, "Universal Mobile Telecommunications System (UMTS); LTE; EVS Codec Detailed Algorithmic Description (3GPP TS 26.445 version 12.0.0 Release 12)", Nov. 2014.
ETSI TS 126 403 V6.0.0, "Universal Mobile Telecommunications System (UMTS); General audio codec audio processing functions; Enhanced aacPlus general audio codec; Encoder specification; Advanced Audio Coding (AAC) part (3GPP TS 26.403 version 6.0.0 Release 6)", Sep. 2004.
ETSI TS 126 401 V6.2.0, "Universal Mobile Telecommunications System (UMTS); General audio codec audio processing functions; Enhanced aacPlus general audio codec; General description (3GPP TS 26.401 version 6.2.0 Release 6)", Mar. 2005.
3GPP TS 26.405, "3rd Generation Partnership Project; Technical Specification Group Services and System Aspects General audio codec audio processing functions; Enhanced aacPlus general audio codec; Encoder specification parametric stereo part (Release 6)", Sep. 2004.
3GPP TS 26.447 V12.0.0, "3rd Generation Partnership Project; Technical Specification Group Services and System Aspects; Codec for Enhanced Voice Services (EVS); Error Concealment of Lost Packets (Release 12)", Sep. 2014.
ISO/IEC Fdis 23003-3:2011 (E), "Information technology—MPEG audio technologies—Part 3: Unified speech and audio coding", ISO/IEC JTC 1/SC 29/WG 11, Sep. 20, 2011.
Valin et al., "Definition of the Opus Audio Codec", Internet Engineering Task Force (IETF) RFC 6716, Sep. 2012.
Nam Sook Lee, "Decision to Grant a Patent for KR Application No. 10-2020-7015511", dated Apr. 19, 2022, KIPO, Republic of Korea.
Nam Sook Lee, "Decision to Grant a Patent for KR Application No. 10-2020-7016100", dated Apr. 21, 2022, KIPO, Republic of Korea.
Nam Sook Lee, "Decision to Grant a Patent for KR Application No. 10-2020-7015836", dated Apr. 28, 2022, KIPO, Republic of Korea.
Nam Sook Lee, "Decision to Grant a Patent for KR Application No. 10-2020-7015512", dated Apr. 20, 2022, KIPO, Republic of Korea.
Nam Sook Lee, "Decision to Grant a Patent for KR Application No. 10-2020-7015835", dated Apr. 22, 2022, KIPO, Republic of Korea.
Xiong-Malvar, "A Nonuniform Modulated Complex Lapped Transform", IEEE Signal Processing Letters, vol. 8, No. 9, Sep. 2001. (Year: 2001).
Raj et al., "An Overview of MDCT for Time Domain Aliasing Cancellation", 2014 International Conference on Communication and Network Technologies (ICCNT). (Year: 2014).
Malvar, "Biorthogonal and Nonuniform Lapped Transforms for Transform Coding with Reduced Blocking and Ringing Artifacts", IEEE Transactions on Signal Processing, vol. 46, No. 4, Apr. 1998. (Year: 1998).
Malvar, "Lapped Transforms for Efficient Transform/Subband Coding", IEEE Transactions on Acoustics, Speech, and Signal Processing, vol. 38, No. 6, Jun. 1990. (Year: 1990).
Malvar, "Fast Algorithms for Orthogonal and Biorthogonal Modulated Lapped Transforms", Microsoft Research, 1998. (Year: 1998).
Princen-Bradley, "Analysis/Synthesis Filter Bank Design Based on Time Domain Aliasing Cancellation", IEEE Transactions on Acoustics, Speech, and Signal Processing, vol. ASSP-34, No. 5, Oct. 1986. (Year: 1986).
Shlien, "The Modulated Lapped Transform, Its Time-Varying Forms, and Its Applications to Audio Coding Standards", IEEE Transactions on Speech and Audio Processing, vol. 5, No. 4, Jul. 1997. (Year: 1997).
Nam Sook Lee, "Decision to Grant a Patent for KR Application No. 10-2020-7016224", dated Jul. 25, 2022, KIPO, Republic of Korea.

* cited by examiner

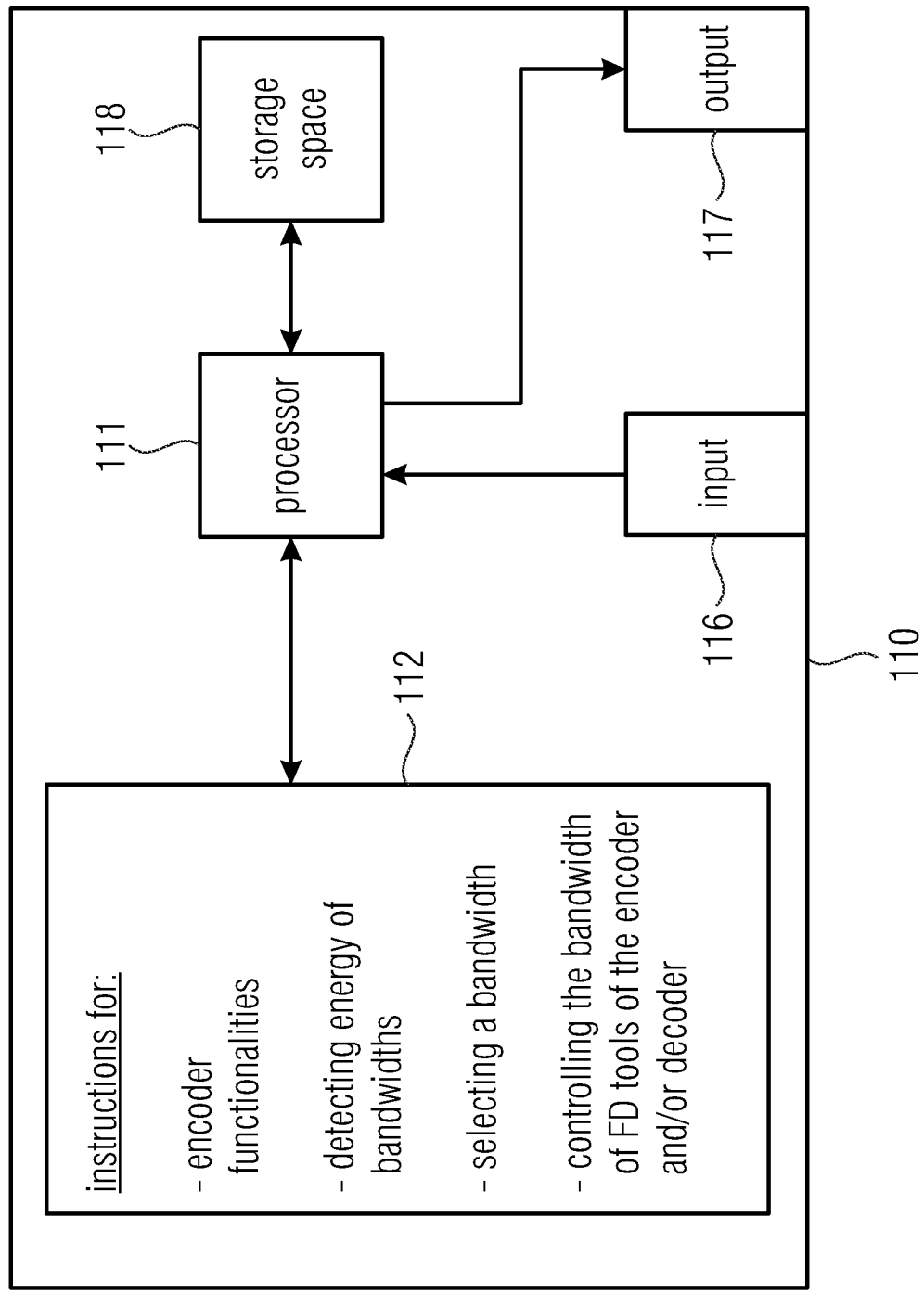

CONTROLLING BANDWIDTH IN ENCODERS AND/OR DECODERS

CROSS-REFERENCES TO RELATED APPLICATIONS

This application is a continuation of copending International Application No. PCT/EP2018/080335, filed Nov. 6, 2018, which is incorporated herein by reference in its entirety, and additionally claims priority from European Application No. EP 17201082.9, filed Nov. 10, 2017, which is incorporated herein by reference in its entirety.

1. CONVENTIONAL TECHNOLOGY

The present examples relate to encoders and decoders and methods for these apparatus, in particular for information signals, such as audio signals.

BACKGROUND OF THE INVENTION

General audio codecs need to transmit music and speech signals in a very good quality. Such audio codecs are for instance used in Bluetooth where the audio signals are transmitted from the mobile phone to a headset or headphone and vice versa.

Quantizing parts of a spectrum to zeros often leads to a perceptual degradation. Therefore, it is possible to replace zero-quantized spectral lines with noise using a noise filler tool operating in the frequency domain (FD).

Temporal noise shaping (TNS) uses open-loop linear prediction in the frequency domain (FD). This predictive encoding/decoding process over frequency effectively adapts the temporal structure of the quantization noise to that of the time signal, thereby efficiently using the signal to mask the effects of noise. In the MPEG2 Advanced Audio Coder (AAC) standard, TNS is currently implemented by defining one filter for a given frequency band, and then switching to another filter for the adjacent frequency band when the signal structure in the adjacent band is different than the one in the previous band.

Especially, for speech signals, the audio content may be bandlimited, meaning the audio bandwidth contains only 4 kHz (narrow band, NB), 8 kHz (wide band, WB) or 16 kHz (super wide band, SWB). Audio codecs need to detect the active audio bandwidth and control the coding tools accordingly. As the detection of the bandwidth is not 100% reliable, technical issues may arise.

Some audio coding tools, e.g. Temporal Noise Shaping (TNS) or noise filling (NF), may cause annoying artefacts when operating on bandlimited audio files, e.g., if the tool is not aware about the active signal part. Assuming that the WB signal is coded at 32 kHz, the tools might fill the upper spectrum (8-16 kHz) with artificial noise.

FIG. 1 shows artificial noise generated by unguided tools: line 11 is the active signal up to WB while the signal 12 is artificially generated by a parametric tool, e.g. by noise filling, which is not aware of the active audio bandwidth.

Therefore, the tools need to be restricted to operate only on the active frequency regions.

Some codecs like AAC are configured so as to send the information on active spectrum per scale factor band. This information is also used to control the coding tools. This provides precise results but involves a significant amount of side information to be transmitted. As speech is usually just transmitted in NB, WB, SWB and FB, this limited set of possible active bandwidths is advantageously used to limit the side information.

It is unavoidable that a bandwidth detector returns wrong results from time to time. For instance, a detector may see the fade out of a music signal and interprets this as a low bandwidth case. For codecs, which switch between the different bandwidth modes (NB, WB, SWB, FB) in a hard manner, e.g. 3GPP EVS codec [1], this results in a rectangular spectral hole. Hard manner means that the complete coding operation is limited to the detected bandwidth. Such hard switch can result in audible artefacts. FIG. 2 outlines the spectral hole 22 resulting from a wrong detection.

FIG. 2 shows a schematic outline of wrong bandwidth detection: all coding tools work on lower audio bandwidth, leading to rectangular spectral hole 22.

It is requested to overcome or reduce impairments such as those identified above.

1.1 References

[1] 3 GPP EVS Codec, http://www.3gpp.org/ftp//Specs/archive/26_series/26.445/26445-e10.zip, Section 5.1.6 "Bandwidth detection"

2. SUMMARY

According to an embodiment, an encoder apparatus may have: a plurality of frequency domain, FD, encoder tools for encoding an information signal, the information signal presenting a plurality of frames; and an encoder bandwidth detector and controller configured to select a bandwidth for at least a subgroup of the plurality of FD encoder tools, the subgroup including less FD encoder tools than the plurality of FD encoder tools, on the basis of information signal characteristics so that at least one of the FD encoder tools of the subgroup has a different bandwidth with respect to at least one of the FD encoder tools which are not in the subgroup.

According to another embodiment, a decoder apparatus may have: a plurality of FD decoder tools for decoding an information signal encoded in a bitstream, wherein: the FD decoder tools are divided:
  in a subgroup including at least one FD decoder tool;
  in remaining FD decoder tools including at least one FD decoder tool;
  wherein the decoder apparatus is configured so that at least one of the plurality of decoder tools of the subgroup performs signal processing a different bandwidth with respect to at least one of the remaining FD decoder tools of the plurality of decoder tools.

According to another embodiment, a system may have: an inventive encoder apparatus and an inventive decoder apparatus.

According to another embodiment, a method for encoding an information signal according to at least a plurality of operations in the frequency domain, FD, may have the steps of: selecting a bandwidth for a subgroup of FD operations; performing first signal processing operations at the a bandwidth for the subgroup of FD operations; performing second signal processing operations at a different bandwidth for FD operations which are not in the subgroup.

According to yet another embodiment, a method for decoding a bitstream with an information signal and control data, the method including a plurality of signal processing operations in the frequency domain, FD, may have the steps of: choosing a bandwidth selection for a subgroup of FD operations on the basis of the control data; performing first signal processing operations at the a bandwidth for the subgroup of FD operations; performing second signal processing operations at a different bandwidth for FD operations which are not in the subgroup.

In accordance with examples, there is provided an encoder apparatus comprising:
- a plurality of frequency domain, FD, encoder tools for encoding an information signal, the information signal presenting a plurality of frames; and
- an encoder bandwidth detector and controller configured to select a bandwidth for at least a subgroup of the plurality of FD encoder tools, the subgroup including less FD encoder tools than the plurality of FD encoder tools, on the basis of information signal characteristics so that at least one of the FD encoder tools of the subgroup has a different bandwidth with respect to at least one of the FD encoder tools which are not in the subgroup.

Accordingly, it is possible to avoid spectral holes while maintaining in case of wrong detection of the bandwidth.

In accordance with examples, at least one FD encoder tool of the subgroup may be a temporal noise shaping, TNS, tool and/or a noise level estimator tool.

In accordance with examples, at least one FD encoder tool which is not in the subgroup is chosen among at least on of linear predictive coding, LPC, based spectral shaper, a spectral noise shaper, SNS, tool a spectral quantizer, and a residual coder.

In accordance with examples, the encoder bandwidth detector and controller is configured to select the bandwidth of the at least one FD encoder tool of the subgroup between at least a first bandwidth common to at least one of the FD encoder tools which are not in the subgroup and a second bandwidth different from the bandwidth of the at least one of the FD encoder tools which are not in the subgroup.

In accordance with examples, the encoder bandwidth detector and controller is configured to select the bandwidth of the at least one of the plurality of FD encoder tools on the basis of at least one energy estimate on the information signal.

In accordance with examples, the encoder bandwidth detector and controller is configured to compare at least one energy estimation associated to a bandwidth of the information signal to a respective threshold to control the bandwidth for the at least one of the plurality of FD encoder tools.

In accordance with examples, the at least one of the plurality of FD encoder tools of the subgroup comprises a TNS configured to autocorrelate a TNS input signal within the bandwidth chosen by the encoder bandwidth detector and controller.

In accordance with examples, the at least one of the FD encoder tools which are not in the subgroup is configured to operate at a full bandwidth.

Therefore, the bandwidth selection operates only for the tools of the subgroup (e.g., TNS, noise estimator tool).

In accordance with examples, the encoder bandwidth detector and controller is configured to select at least one bandwidth which is within the full bandwidth at which the at least one of the FD encoder tools which are not in the subgroup is configured to operate.

In accordance with examples, the at least one of the remaining FD encoder tools of the plurality of FD encoder tools is configured to operate in open chain with respect to the bandwidth chosen by the encoder bandwidth detector and controller.

In accordance with examples, the encoder bandwidth detector and controller is configured to select a bandwidth among a finite number of bandwidths and/or among a set of pre-defined bandwidths.

Therefore, the choice is limited and there is no necessity of encoding too complicated and/or long parameters. In examples, only one single parameter (e.g., encoded in 0-3 bits) may be used for the bitstream.

In accordance with examples, the encoder bandwidth detector and controller is configured to perform a selection among at least one or a combination of: a 8 KHz, 16 KHz, 24 KHz, 32 KHz, and 48 KHz, and/or NB, WB, SSWB, SWB, FB, etc.

In accordance with examples, the encoder bandwidth detector and controller is configured to control the signalling of the bandwidth to a decoder.

Therefore, also the bandwidth of signals processed by some tools at the decoder may be controlled (e.g., using the same bandwidth).

In accordance with examples, the encoder apparatus is configured to encode a control data field including an information regarding the chosen bandwidth.

In accordance with examples, the encoder apparatus is configured to define a control data field including:
- 0 data bits corresponding to NB bandwidth;
- 1 data bit corresponding to NB, WB bandwidth;
- 2 data bits corresponding to NB, WB, SSWB bandwidth;
- 2 data bits corresponding to NB, WB, SSWB, SWB bandwidth;
- 3 data bits corresponding to NB, WB, SSWB, SWB, FB bandwidth.

In accordance with examples, the encoder apparatus at least one energy estimation is performed by:

$$E_B(n) = \sum_{k=I_{f_s}(n)}^{I_{f_s}(n+1)-1} \frac{X(k)^2}{I_{f_s}(n+1) - I_{f_s}(n)} \quad \text{for } n = 0 \ldots N_B - 1$$

where $X(k)$ are MDCT (or MDST . . . ) coefficients, $N_B$ is the number of bands and $I_{f_s}(n)$ are the indices associated to the band.

In accordance with examples, the encoder apparatus comprises a TNS tool which may be configured to perform a filtering operation including the calculation of an autocorrelation function. One of the possible autocorrelation functions may be in the following form:

for each $k = 0 \ldots 8$ $$r(k) = \begin{cases} r_0(k), & \text{if } \prod_{s=0}^{2} e(s) = 0 \\ \sum_{s=0}^{2} \frac{\sum_{n=sub\_start(f,s)}^{sub\_stop(f,s)-1-k} X_s(n) X_s(n+k)}{e(s)}, & \text{otherwise} \end{cases}$$

with $$r_0(k) = \begin{cases} 1, & \text{if } k = 0 \\ 0, & \text{otherwise} \end{cases}$$

and $$e(s) = \sum_{n=sub\_start(f,s)}^{sub\_stop(f,s)-1} X_s(n)^2 \quad \text{for } s = 0 \ldots 2$$

where $X(k)$ are MDCT coefficients, sub_start(f,s) and sub_stop(f,s) are associated to the particular bandwidth as detected by the encoder bandwidth detector and controller.

In accordance with examples, the encoder apparatus may comprise a noise estimator tool which may be configured to estimate a noise level. One of the procedures used for such an estimation may be in the form of $$L_{NF} = \frac{\sum_{k=0}^{N_E-1} I_{NF}(k) \cdot \frac{|X_f(k)|}{gg}}{\sum_{k=0}^{N_E-1} I_{NF}}$$

where gg refers to the global gain, $I_{NF}(k)$ to the identification of the spectral lines on which the noise level is to be estimated, and $X_f(k)$ is the signal (e.g., the MDCT or MDST or another FD spectrum after TNS).

In examples, $I_{NF}(k)$ may be obtained with:

$$I_{NF}(k) = \begin{cases} 1 & \text{if } 24 \leq k < bw_{stop} \text{ and} \\ & X_q(i) == 0 \text{ for all } i = k - 3 \ldots \min(bw\_stop, k+3) \\ 0 & \text{otherwise} \end{cases}$$

where $bw_{stop}$ depends on the bandwidth detected by the encoder bandwidth detector and controller.

In accordance with examples, there may be provided a decoder apparatus comprising a plurality of FD decoder tools for decoding an information signal encoded in a bitstream, wherein:
the FD decoder tools are subdivided:
in a subgroup comprising at least one FD decoder tool;
in remaining FD decoder tools comprising at least one FD decoder tool;
wherein the decoder apparatus is configured so that the at least one of the plurality of decoder tools of the subgroup performs signal processing a different bandwidth with respect to at least one of the remaining FD decoder tools of the plurality of decoder tools.

In accordance with examples, the decoder apparatus may comprise a bandwidth controller configured to choose the bandwidth on the basis of the bandwidth information.

In accordance with examples, the decoder apparatus may be such that the subgroup comprises at least one of a decoder noise estimator tool and/or a temporal noise shape, TNS, decoder.

In accordance with examples, the at least one of the remaining FD decoder tools is at least one of a linear predictive coding, LPC, decoder tool, spectral noise shaper decoder, SNS, tool, a decoder global gain tool, an MDCT or MDST shaping tool.

In accordance with examples, the decoder apparatus may be configured to control the bandwidth of the at least one of the plurality of decoder tools in the subgroup between:
at least a first bandwidth common to at least one of the remaining FD decoder tools; and
at least a second bandwidth different from the first bandwidth.

In accordance with examples, the at least one of the FD remaining decoder tools is configured to operate at a full bandwidth.

In accordance with examples, the at least one of the remaining FD decoder tools is configured to operate in open chain with respect to the bandwidth (e.g., chosen by the bandwidth controller).

In accordance with examples, the bandwidth controller is configured to choose a bandwidth among a finite number of bandwidths and/or among a set of pre-defined bandwidths.

In accordance with examples, the bandwidth controller is configured to perform a choice among at least one or a combination of: a 8 KHz, 16 KHz, 24 KHz, 32 KHz, and 48 KHz and/or NB, WB, SSWB, SWB, FB.

In accordance with examples, the decoder may be further comprising a noise filling tool (46) configured to apply a noise level using indices. A technique for obtaining the indices may provide, for example:

$$I_{NF}(k) = \begin{cases} 1 & \text{if } 24 \leq k < bw_{stop} \text{ and} \\ & \widetilde{X_q}(i) == 0 \text{ for all } i = k - 3 \ldots \min(bw\_stop, k+3) \\ 0 & \text{otherwise} \end{cases}$$

where $bw_{stop}$ is obtained on the basis of bandwidth information in the bitstream.

In accordance with examples, the decoder apparatus may comprise a TNS decoder tool configured to perform at least some of the following operations:

$s^0(\text{start\_freq}(0)-1)=s^1(\text{start\_freq}(0)-1)= \ldots =s^7(\text{start\_freq}(0)-1)=0$ for f=0 to num_tns_filters−1 do
for n=start_freq(f) to stop_freq(t)−1 do $t^K(n) = \widehat{X_f}(n)$ for k=7 to 0 do $t^k(n) = t^{k+1}(n) - rc_q(k)s^k(n-1)$ $s^{k+1}(n) = rc_q(k)t^k(n) + s^k(n-1)$ $\widehat{X_s}(n) = s^0(n) = t^0(n)$ where $\widehat{X_s}(n)$ is the output of the TNS decoder and $\widehat{X_f}(n)$ is the input of the TNS decoder, num_tns_filters, start_freq, stop_freq are obtained on the basis of bandwidth information in the bitstream.

Coding tools like TNS or noise filling can create unwanted artificial noise in the silent sections of band limited signals. Therefore, bandwidth detectors are usually in-cooperated to control the bandwidth all coding tools should work on. As bandwidth detection might lead to uncertain results, such wrong detection might lead to audible artefacts such as sudden limitation of audio bandwidth.

To overcome the problem, in some examples some tools, e.g., the quantizer, are not controlled by the bandwidth detector. In case of miss-detection, the quantizer can code the upper spectrum—even tough in low quality—to compensate the problem.

3. BRIEF DESCRIPTION OF THE DRAWINGS

Embodiments of the present invention will be detailed subsequently referring to the appended drawings, in which:
FIG. 1 shows artificial noise generated by unguided tools;
FIG. 2 shows a schematic outline of wrong bandwidth detection;
FIGS. 3a and 3b show encoder apparatus according to examples;
FIGS. 4a and 4b show decoder apparatus according to examples;
FIG. 5 shows a scheme in case of wrong bandwidth detection;
FIG. 6a-6c show methods according to examples;

FIGS. 8a and 8b show apparatus according to examples.

4. DETAILED DESCRIPTION OF THE INVENTION

The invention described in this document permits to avoid the occurrence of spectral holes even when the bandwidth detector returns a wrong result. In particular, soft band switching for audiocoding applications may be obtained.

A key aspect is that parametric coding tools, e.g. TNS and NF, may be strictly controlled by the bandwidth detector and controller 39 while the remaining coding, i.e. LPC based spectral shaper or spectral noise shaper, SNS, spectral quantizer and residual coder, still work on the full audio bandwidth up to the Nyquist frequency.

Figure 1:
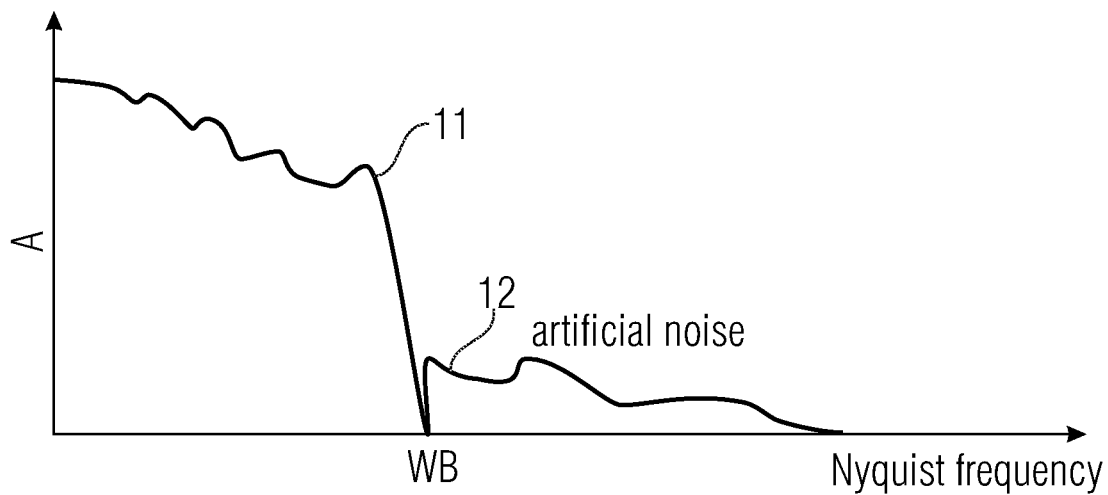
Figure 2:
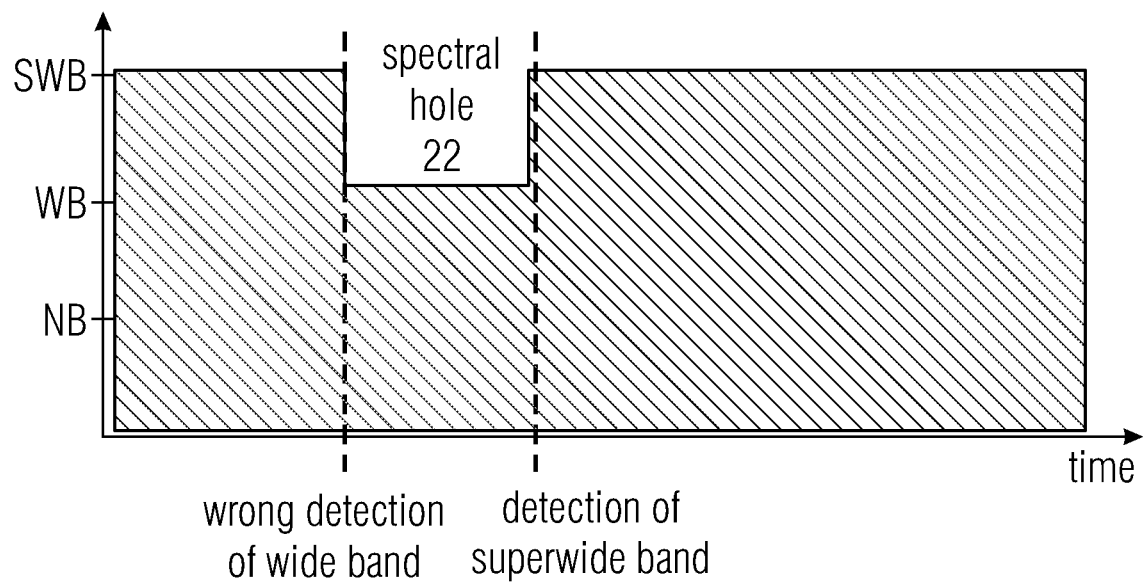
Figure 3A:
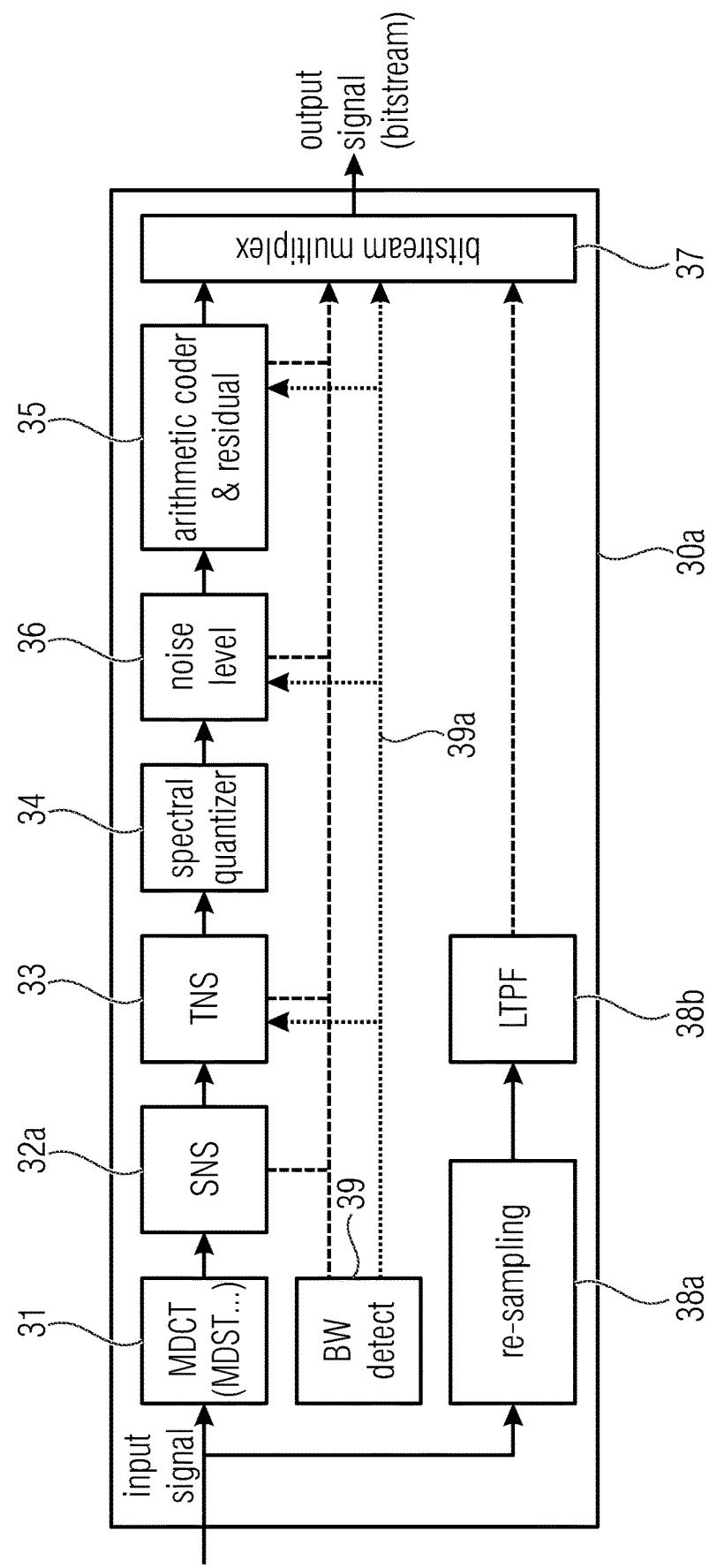
Figure 3B:
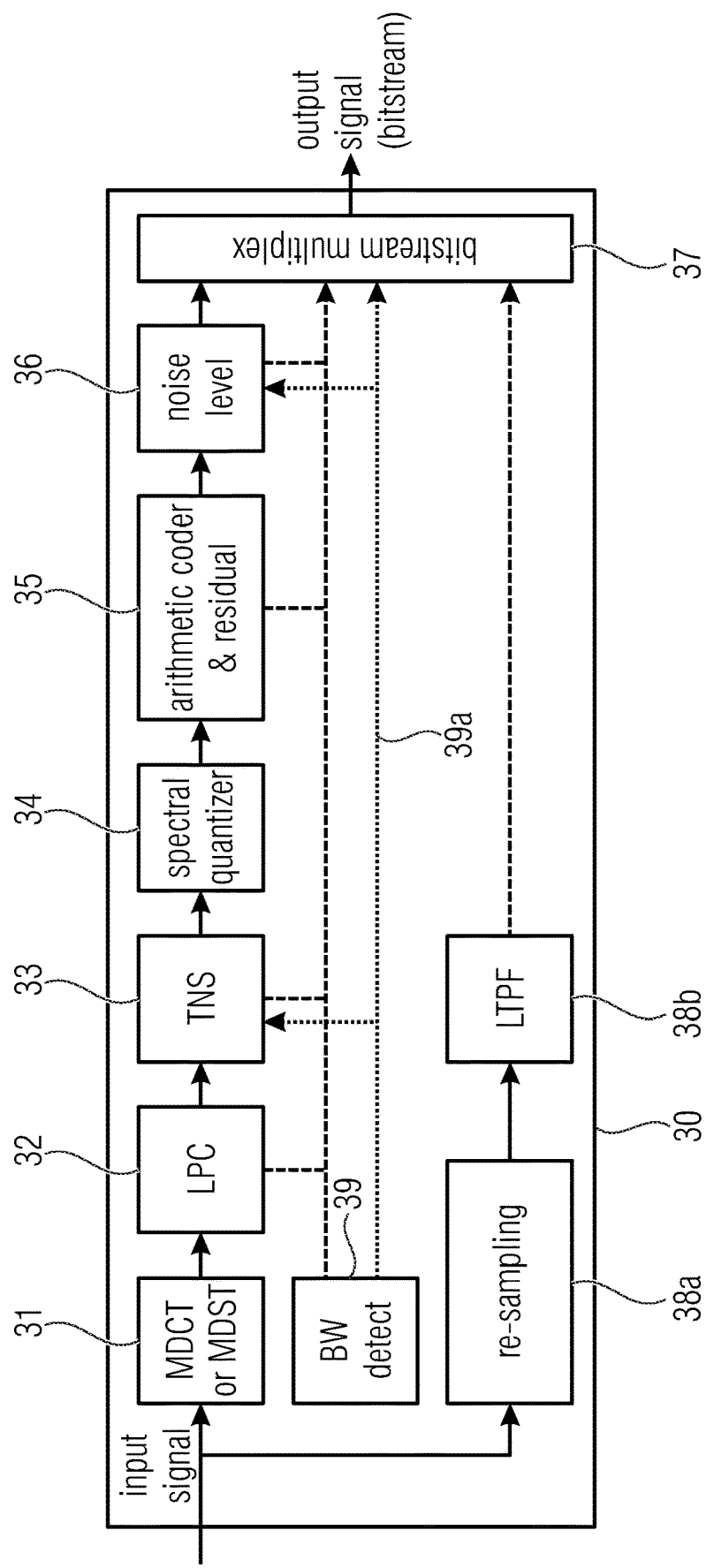

FIGS. 3b and 3a outline examples of an encoder apparatus 30 and 30a where a bandwidth (BW) detector and controller 39 estimates the current audio bandwidth in the frame based on energies derived from an MDCT or MDST spectrum (or other FD spectrum).

On the decoder side (FIGS. 4b and 4a), the guiding bandwidth information for TNS and NF is extracted from the bitstream and the tools are controlled accordingly.

As a result, artificially generated noise in non-active spectral regions is avoided due to the bandwidth parameter used to control the TNS and NF coding tools (unguided tools). The tool just work on the active audio part and therefore do not generate any artificial noise.

On the other side, the audible effect of wrong detections (false bandwidth detection) can be reduced significantly as the remaining coding tools, e.g. spectral quantizer, LPC shaper or SNS (spectral noise shaper) and residual coder, still work up to the Nyquist frequency. In case of wrong detections, these tools can code the upper frequency—at least with some more distortions compared to a regular coding—and therefore avoid the more severe impression that the audio bandwidth suddenly drops.

Figure 5:
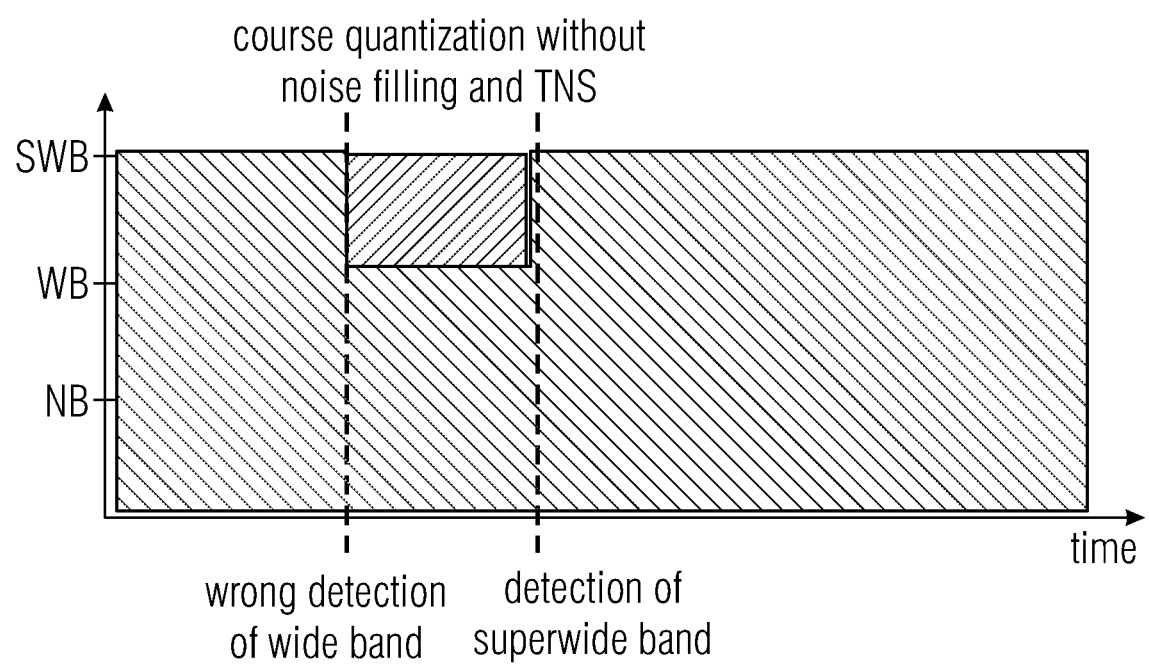

FIG. 5 shows a new scheme in case of wrong bandwidth detection: spectral hole is quantized sparsely but avoids an audible bandwidth drop.

In case the region outlined in the figure above contains mostly zero values, the arithmetic coder does not need to code those as the information on the last non-zero spectral tuple is transmitted as side information for the arithmetic coder. This means there is no overhead involved for the arithmetic coder.

The side information that may be used for the transmitted bandwidth is also minimized. Due the robust switching behavior, a signaling of the typically used communication audio bandwidths, i.e. NB, WB, SSWB and SWB, is appropriate.

This technique also allows to build less complex bandwidth detectors which do not use frame dependencies and long history memories to get stable decisions, see the EVS codec [1] Section 5.1.6. This means, the new technique allows the bandwidth detector and controller 39 to react very fast on any audio bandwidth change.

Accordingly, a bandwidth information is used to only control specific tools of a codec (e.g., audio codec) while keeping the remaining tools in another operation mode (e.g., full bandwidth).

5. EXAMPLES

5.1 the Bandwidth Detection and Control of the Tools

An information signal (e.g., an audio signal) may be described in the time domain, TD, as a succession of samples (e.g., x(n)) acquired at different discrete time instants (n). The TD representation may be made of a plurality of frames, each associated to a plurality of samples (e.g., 2048 samples per frame). In the frequency domain, FD, a frame may be represented as a succession of bins (e.g., X(k)), each associated to a particular frequency (each frequency being associated to an index k).

FIGS. 3b and 3a show encoder apparatus 30 and 30a, respectively, each comprising an encoder bandwidth detector and controller 39 which is capable of selecting a bandwidth for some tools (a subgroup at the encoder) of the encoder apparatus 30 or 30a, so that other tools operate at different bandwidth. The encoder bandwidth detector and controller 39 is also capable of selecting the bandwidth for at least some of the tools of a decoder (a subgroup at the decoder). 39a refers to the bandwidth selection information provided by the encoder bandwidth detector and controller 39 to the tools of the subgroup (e.g., 33, 36) and/or to a decoder.

Each of the encoder apparatus 30 and 30a may comprise a low delay modified discrete cosine transform, MDCT, tool 31 or low delay modified discrete sine transform, MDST, tool 31 (or a tool based on another transformation, such as a lapped transformation) which may convert an information signal (e.g., an audio signal) from a time domain, TD, representation to a frequency domain, FD, representation (e.g., to obtain MDCT, MDST, or, more in general, FD coefficients).

The encoder apparatus 30 may comprise a linear predictive coding, LPC, tool 32 for performing an LPC analysis in the FD.

The encoder apparatus 30a may comprise an SNS tool 32a for performing an SNS analysis in the FD.

Each of the encoder apparatus 30 and 30a may comprise a temporal noise shaping, TNS, tool 33, to control the temporal shape of noise within each window of the information signal (e.g., as output by the MDCT or MDST tool) in the FD.

Each of the encoder apparatus 30 and 30a may comprise a spectral quantizer 34 processing signals in the in the FD. The signal as output by the TNS tool 33 may be quantized, e.g., using dead-zone plus uniform thresholds scalar quantization. A gain index may be chosen so that the number of bits needed to encode the quantized FD signal is as close as possible to an available bit budget.

Each of the encoder apparatus 30 and 30a may comprise a coder 35 processing signals in the FD, for example, to perform entropy coding, e.g., to compress a bitstream. The coder 35 may, for example, perform residual coding and/or arithmetic coding.

Each of the encoder apparatus 30 and 30a may comprise, for example, a noise level estimator tool 36, processing signals in the FD, to estimate the noise, quantize it, and/or transmit it in a bitstream.

In examples, the level estimator tool 36 may be placed upstream or downstream to the coder 35.

Each of the encoder apparatus 30 and 30a may comprise tools which process signals in the time domain, TD. For example, the encoder apparatus 30 or 30a may comprise a re-sampling tool 38*a* (e.g., a downsampler) and/or a long term postfiltering, LTPF, tool 38*b*, for controlling an LTPF active in TD at the decoder.

Each of the encoder apparatus 30 and 30*a* may comprise a bitstream multiplexer tool 37 to prepare a bitstream with data obtained from TD and/or FD tools placed upstream. The bitstream may comprise a digital representation of an information signal together with control data (including, for example, a bandwidth information for selecting the bandwidth at some tools of the decoder) to be used at the decoder. The bitstream may be compressed or include portions which are compressed.

Therefore, each of the encoder apparatus 30 and 30*a* may comprise FD tools (e.g., 31-36) and, in case, TD tools (e.g., 38*a*, 38*b*).

The encoder bandwidth detector and controller 39 may control the bandwidth of FD tools forming a first group (subgroup), such as the temporal noise shaping, TNS, tool 33, and/or the noise estimator tool 36. The TNS tool 33 may be used to control the quantization noise. The bandwidth at which FD tools which are not in the subgroup (such as at least one of the LPC tool 32 and/or the SNS tool 32*a*, the spectrum quantizer 34, and the coder 35) perform signal processing may therefore be different from the bandwidth at which the tools of the subgroup (e.g., 33, 36) perform signal processing. For example, the bandwidth for the FD tools which are not in the subgroup may be greater, e.g., may be a full bandwidth.

In examples, the encoder bandwidth detector and controller 39 may be a part of a digital signal processor which, for example, implements also other tools of the encoder apparatus.

Figure 4A:
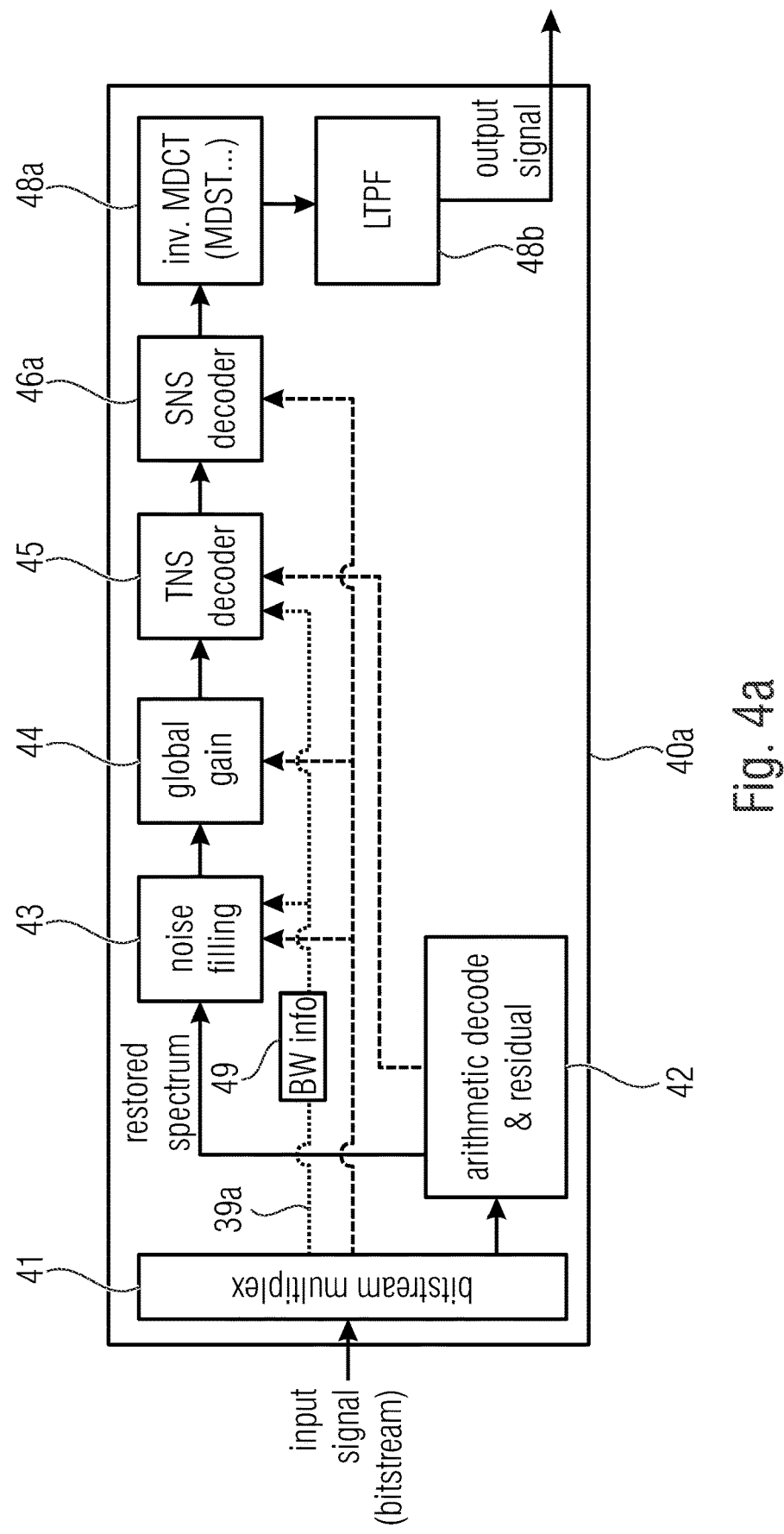
Figure 4B:
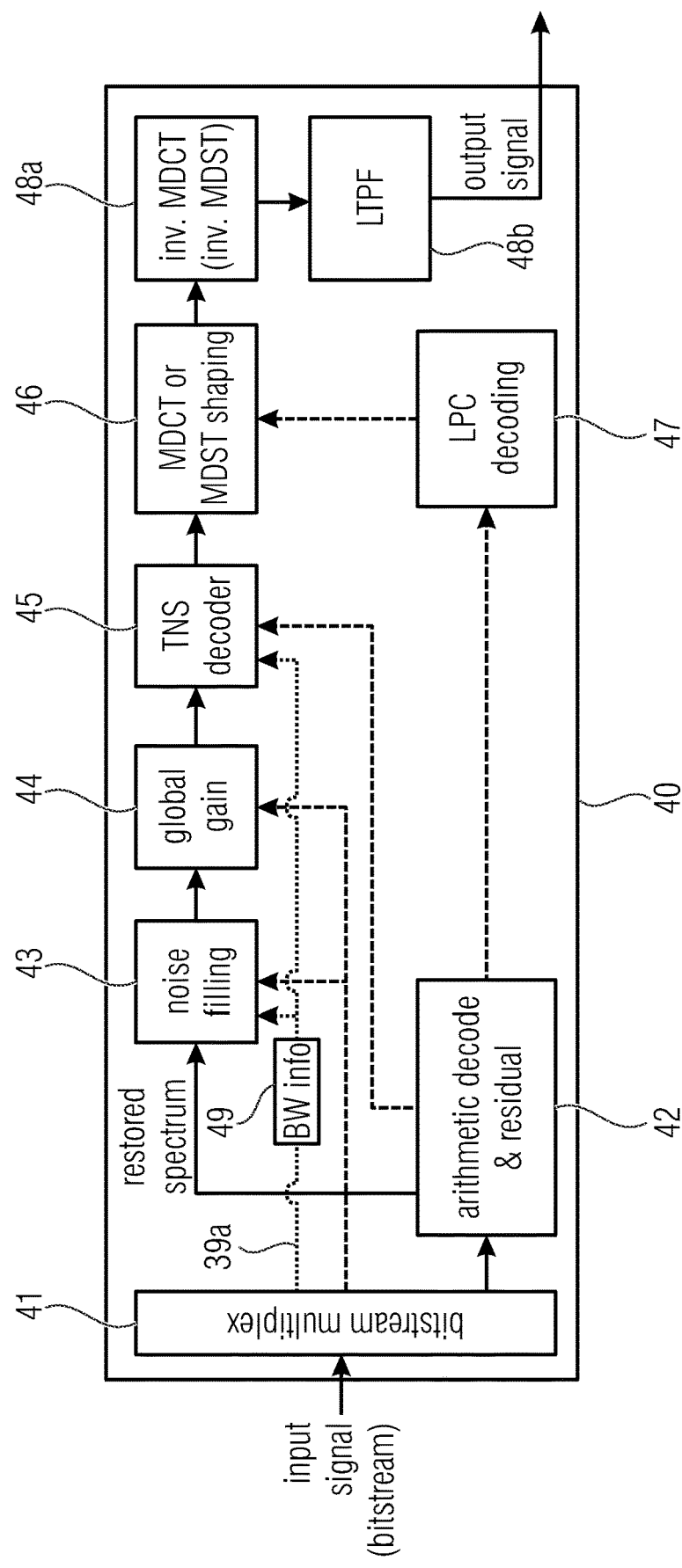

FIGS. 4*b* and 4*a* show decoder apparatus 40 and 40*a*, respectively, each of which may decode a digital representation of an information signal as encoded by the encoder 30 or 30*a*, for example. Each of the decoder apparatus 40 and 40*a* may comprise FD tools and, in case, TD tools.

Each of the decoder apparatus 40 and 40*a* may comprise a bitstream multiplex tool 41 to obtain a bitstream (e.g., by transmission) from an encoder apparatus (e.g., the apparatus 30 or 30*a*). For example, an output from the encoder apparatus 30 or 30*a* may be provided as an input signal to the decoder apparatus 40 or 40*a*.

Each of the decoder apparatus 40 and 40*a* may comprise a decoder 42 which may, for example, decompress data in the bitstream. Arithmetic decoding may be performed. Residual decoding may be performed.

Each of the decoder apparatus 40 and 40*a* may comprise a noise filling tool 43 processing signals in the FD.

Each of the decoder apparatus 40 and 40*a* may comprise a global gain tool 44 processing signals in the FD.

Each of the decoder apparatus 40 and 40*a* may comprise a TNS decoder tool 45 processing signals in the FD. TNS can be briefly described as follows. At the encoder-side and before quantization, a signal is filtered in the frequency domain (FD) using linear prediction, LP, in order to flatten the signal in the time-domain. At the decoder-side and after inverse quantization, the signal is filtered back in the frequency-domain using the inverse prediction filter, in order to shape the quantization noise in the time-domain such that it is masked by the signal.

Each of the decoder apparatus 40 and 40*a* may comprise an MDCT or MDST shaping tool 46 (other kinds of shaping tools may be used). Notably, the MDCT or MDST shaping tool 46 may process signals by applying scale factors (or quantized scale factors) obtained from the encoder SNS tool 32*a* or gain factors computed from decoded LP filter coefficients (obtained from an LPC decoding tool 47) transformed to the MDCT or MDST spectrum.

Each of the decoder apparatus 40 and 40*a* may comprise an inverse low delay inverse MDCT or MDST tool 48*a* to transform signal representations from FD to TD (tools based on other kinds of inverse transform may be used).

Each of the decoder apparatus 40 and 40*a* may comprise an LTPF tool 48*b* for performing a postfilter in the TD, e.g., on the basis of the parameters provided by the component 38*b* at the decoder.

Each of the decoder apparatus 40 and 40*a* may comprise a decoder bandwidth controller 49 configured to select the bandwidth of at least one of the FD tools. In particular, the bandwidth of a subgroup (e.g., formed by the tools 43 and 45) may be controlled so as to be different from the bandwidth at which other FD tools (42, 44, 46, 47) process signals. The bandwidth controller 49 may be input with a signal 39*a* which has been prepared at the encoder side (e.g., by the bandwidth detector and controller 39) to indicate the selected bandwidth for at least one of the subgroups (33, 36, 43, 45).

In examples, the decoder bandwidth controller 49 may perform operations similar to those processed by the encoder bandwidth detector and controller 39. However, in some examples, the decoder bandwidth controller 49 may be intended as a component which obtains control data (e.g., encoded in a bitstream) from the encoder bandwidth detector and controller 39 and provides the control data (e.g., bandwidth information) to the tools of the subgroup (e.g., decoder noise filling tool 43 and/or TNS decoder tool 45). In examples, the controller 39 is a master and the controller 49 is a slave. In examples, the decoder bandwidth controller 49 may be a part or a section of a digital signal processor which, for example, implements also other tools of the decoder.

In general, the bandwidth controllers 39 and 49 may operate so that the FD tools of the subgroups (e.g., 33 and 36 for the encoder apparatus and/or 43 and 45 for the decoder apparatus) have a same frequency band, while the other FD tools of the decoder and/or encoder have another frequency band (e.g., a broader band).

It has been noted, in fact, that accordingly it is possible to reduce impairments of conventional technology. While for some FD tools (e.g., TNS tools, noise filling tools) it may be advantageous to actually perform a band selection, for other FD tools (e.g., 32, 34, 35, 42, 44, 46, 47) it may be advantageous to process signals at a broader band (e.g. full band), Accordingly, it is possible to avoid spectral holes that would be present in case of hard selection of the bandwidth for all the tools (in particular when a wrong band is selected).

In examples, the bandwidth that is selected by the decoder bandwidth controller 49 may be one of a finite number of choices (e.g., a finite number of bandwidths). In examples, it is possible to choose among narrow band NB (e.g., 4 KHz), wide band WB (e.g., 8 KHz), semi-super wide band SSWB (e.g., 12 KHz), super wide band SWB (e.g., 16 KHz) or full band FB (e.g., 20 KHz).

The selection may be encoded in a data field by the encoder apparatus, so that the decoder apparatus knows which bandwidths have been selected (e.g., according to a selection performed by the encoder bandwidth detector and controller 39).

Figure 6A:
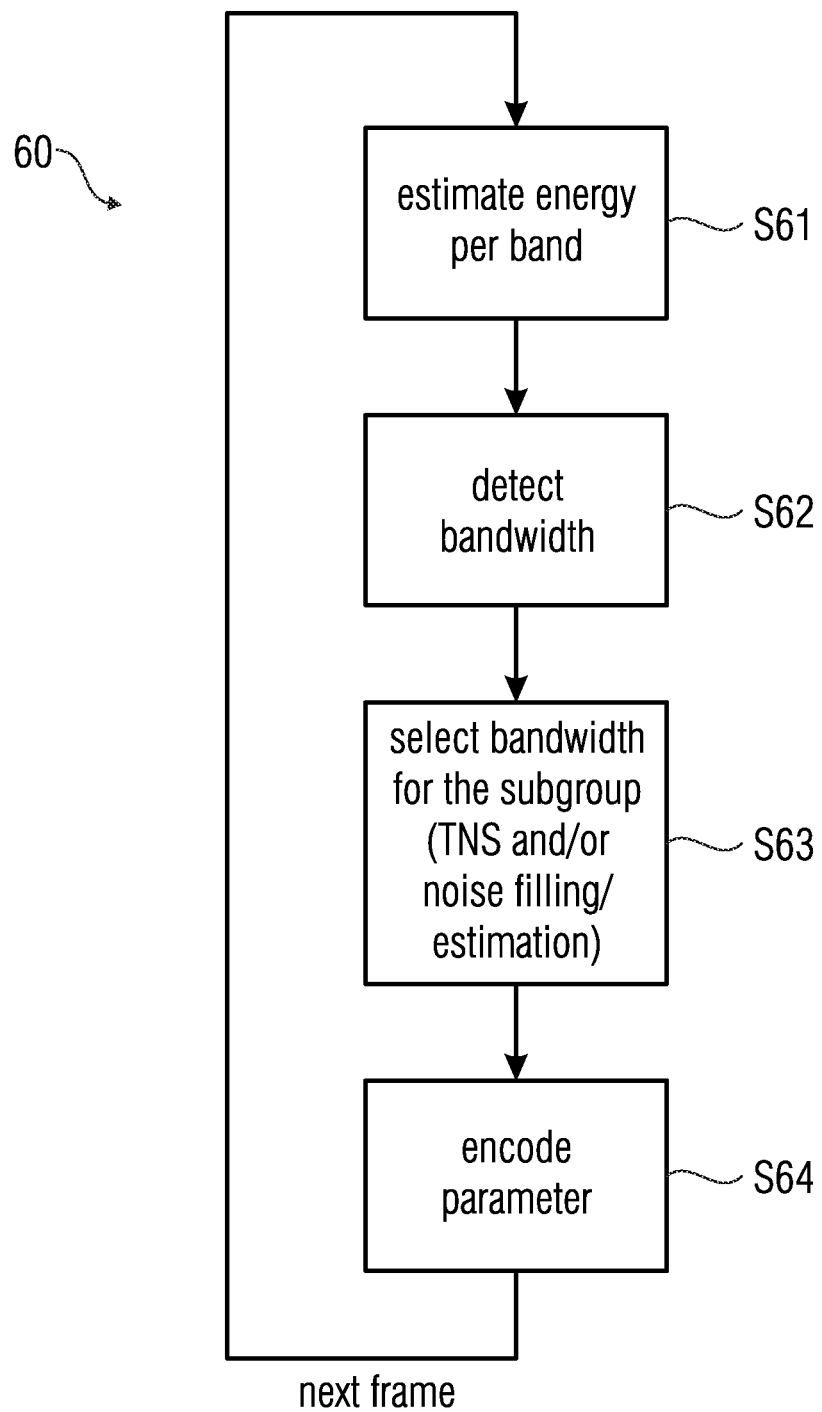

FIG. 6*a* shows a method 60. The method 60 may comprise steps which may be performed, at least in part, by at least one of the controllers 39 and 49. The method 60 may be looped so as to perform operations in association to each frame of the information signal.

At step S61, an energy per band may be estimated (e.g., by the bandwidth detector and controller 39).

At step S62, the bandwidth may be detected (e.g., by the bandwidth detector and controller 39).

At step S63, the detected bandwidth may be selected for at least one of the TNS tool 33 and noise estimation tool 36: these tools will perform their processes at the bandwidth detected at S62.

In addition or in alternative, at step S64 parameters may be defined (and/or encoded) in the bitstream to be stored and/or transmitted and to be used by a decoder. Among the parameters, a bandwidth selection information (e.g., 39a) may be encoded, so that the decoder will know the detected and selected bandwidth for the subgroup (e.g., TNS and noise filling/estimation).

Then, a new frame of the information signal may be examined. Method 60 may therefore cycle by moving to S61. Therefore, a decision may be carried out frame by frame.

Notably, in accordance to the detected bandwidth, a different number of bits may be encoded in the bitstream. In examples, if a bandwidth 8 KHz (NB) is detected, no bits will be encoded in the bitstream. However, the decoder will understand that the bandwidth is 8 KHz.

Each of the encoder apparatus 30 and 30a of FIGS. 3b and 3a may comprise:

a plurality of frequency domain, FD, encoder tools (31-36) for encoding an information signal, the information signal presenting a plurality of frames; and an encoder bandwidth detector and controller 39 configured to select a bandwidth (e.g., at S63) for at least a subgroup (e.g., TNS tool 33, and noise level estimator tool 36) of the plurality of FD encoder tools on the basis of information signal characteristics so that at least one (e.g., 33, 36) of the FD encoder tools of the subgroup has a different bandwidth with respect to at least one of the FD encoder tools (e.g., 31, 32, 34, 35) which are not in the subgroup.

In particular, the encoder bandwidth detector and controller 39 may be configured to select the bandwidth of the at least one FD encoder tool of the subgroup (33, 36) between at least a first bandwidth (e.g., Nyquist frequency) common to at least one (or more) of the FD encoder tools which are not in the subgroup and a second bandwidth (e.g., NB, WB, SSWB, SWB) different from the bandwidth of the at least one (or more) of the FD encoder tools which are not in the subgroup.

Therefore, some tools may operate at bandwidths different from each other and/or perform signal processing using bandwidths different from each other.

The tools which are not in the subgroup (e.g., global gain, spectral noise shaping, and so on) may operate in open chain which respect to the bandwidth selection.

In examples, the encoder bandwidth detector and controller 39 is configured to select (e.g., at S62) the bandwidth of the at least one of the plurality of FD encoder tools (31-36) on the basis of at least one energy estimation (e.g., at S61) on the information signal.

The decoder apparatus 40 of FIG. 4b comprises comprising a plurality of FD decoder tools (43-48a) for decoding an information signal encoded in a bitstream, wherein:

the FD decoder tools are divided:
in a subgroup comprising at least one FD decoder tool (e.g., 43, 45);
in remaining FD decoder tools comprising at least one FD decoder tool (e.g., 44, 46, 48a);

wherein the decoder apparatus 40 or 40a is configured so as to choose a bandwidth for at least one of the plurality of decoder tools of the subgroup (e.g., 43, 45) on the basis of bandwidth information included in the bitstream so that the at least one of the plurality of decoder tools of the subgroup (e.g., 43, 45) performs signal processing a different bandwidth with respect to at least one of the remaining FD decoder tools of the plurality of decoder tools (e.g., 44, 46, 48a).

Figure 6B:
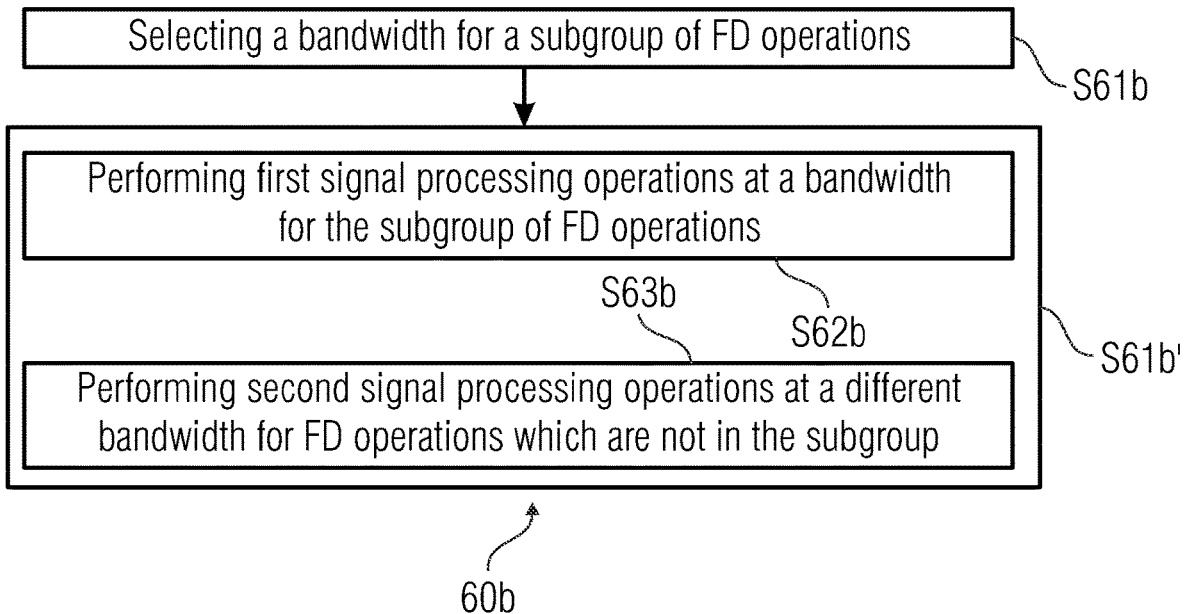

FIG. 6b shows a method 60b. The method 60b may be a method for encoding an information signal according to at least a plurality of operations in the frequency domain, FD, the method comprising:

selecting a bandwidth for a subgroup of FD operations (e.g., S61b);

performing first signal processing operations at the a bandwidth for the subgroup of FD operations (e.g., S62b);

performing second signal processing operations at a different bandwidth for FD operations which are not in the subgroup (e.g., S63b).

It is not necessary, e.g., to perform the steps S61b and S62b in this temporal order. For example, S62b may be performed before S61b. S61b and S62b may also be performed in parallel (e.g., using time-sharing techniques or similar).

Figure 6C:
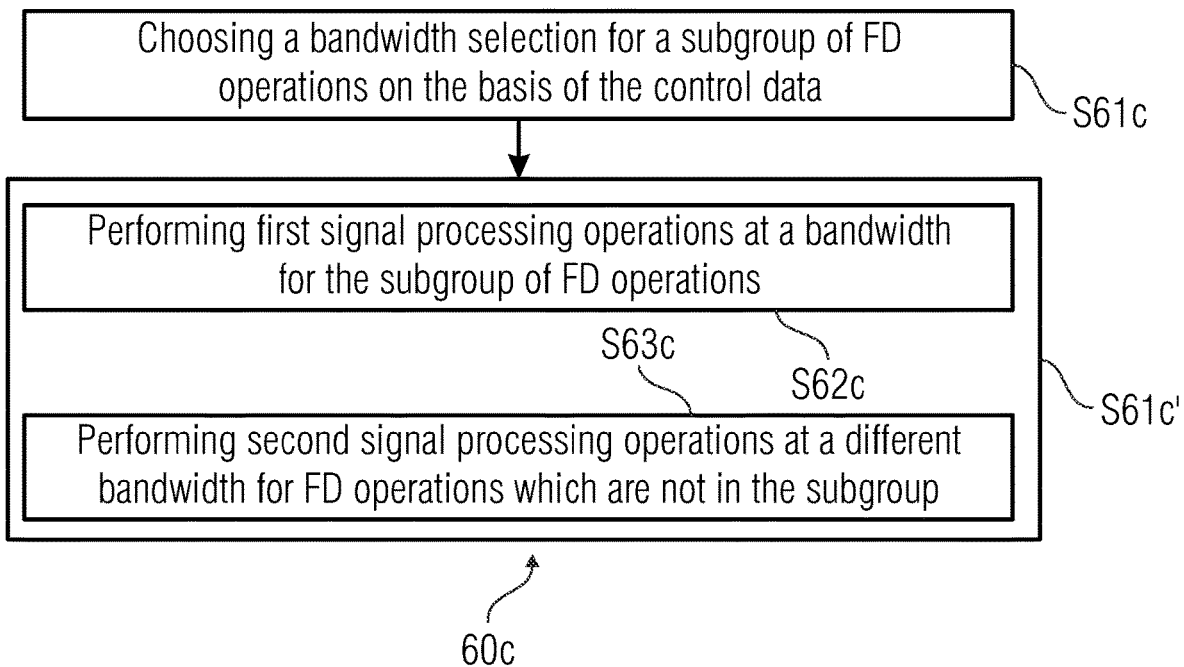

FIG. 6c shows a method 60c. The method 60c may be a method for decoding a bitstream with an information signal and control data (e.g., 39a), the method comprising a plurality of signal processing operations in the frequency domain, FD, the method comprising:

choosing a bandwidth selection for a subgroup of FD operations on the basis of the control data (S61c);

performing first signal processing operations at the a bandwidth for the subgroup of FD operations (S62c);

performing second signal processing operations at a different bandwidth for FD operations which are not in the subgroup (S63c).

It is not necessary, e.g., to perform the steps S61c and S62c in this temporal order. For example, S62c may be performed before S61c. S61c and S62c may also be performed in parallel (e.g., using time-sharing techniques or similar).

According to an example, the encoder bandwidth detector and controller 39 may detect the energy per band, e.g., using an equation such as:

$$E_B(n) = \sum_{k=I_{f_S}(n)}^{I_{f_S}(n+1)-1} \frac{X(k)^2}{I_{f_S}(n+1) - I_{f_S}(n)} \text{ for } n = 0 \ldots N_B - 1$$

where X(k) are the MDCT or MDST coefficients (or any other representation of the signal in the FD), $N_B$ (e.g., 64) is the number of bands and $I_{f_S}(n)$ are the indices associated to the band (each index being associated to a bin).

It is therefore possible to detect (e.g., at S62) the bandwidth (e.g., among a finite number of bandwidths). The encoder bandwidth detector and controller 39 may be able to detect the commonly used bandwidth in speech communication, i.e. 4 kHz, 8 kHz, 12 kHz and 16 kHz. For example, it is possible to detect the quietness of each bandwidth. In case of a positive detection of quietness for a bandwidth, a dedicated cut-off characteristics on the spectrum is further detected. For example, a flag (or in any case a data) regarding the detection of quietness may be obtained as:

$$F_Q(bw) = \sum_{n=I_{bw\_start}(bw)}^{I_{bw\_stop}(bw)} \frac{E_b(n)}{I_{bw\_stop}(bw) - I_{bw\_start}(bw) + 1} < T_Q(bw) \text{ for } bw = N_{bw} - 1 \ldots 0$$

The $F_Q(bw)$ is a binary value which is 1 if the summation is less than $T_Q(bw)$, and 0 if the summation is greater than $T_Q(bw)$. $F_Q(bw)$, associated to a particular bandwidth bw, indicates quietness (e.g., with logical value "1") when the summation of the energy values is less than a threshold for the particular bandwidth bw (and "0" otherwise). The summation relates to the sum of energy values at different indexes (e.g., energy per bin or band), e.g., for n from a first index of the bandwidth associated to the index $I_{bw\_start}(bw)$ to a last index of the bandwidth associated to the index $I_{bw\_stop}(bw)$. The number of the examined bandwidths is $N_{bw}$.

The procedure may stop when $F_Q(bw) == 0$ (energy greater than the threshold for the bandwidth bw). In case $F_Q(bw+1) == 1$, the flags $F_C(b)$ indicating the cut-off characteristic of the spectrum may be detected by $$F_C(b) = [10 \log_{10}(E_b(b-D)) - 10 \log_{10}(E_b(b))] < T_C(bw)$$

for b=$I_{bw\_start}(bw) \ldots I_{bw\_start}(bw) - D$ where D defines the distance between the bands where the cut-off characteristic should be checked, i.e. D(bw).

Then, it is possible to define a final information (bandwidth information or bandwidth selection information) to be used to control a subgroup (e.g., TNS tool 33 and/or noise level estimation tool 36 and/or the TNS decoder tool 45 and/or noise filling tool 43). The final information may be, for example, encoded in some bits and may take the form of such as $$P_{bw} = \begin{cases} bw, & \text{if } \sum F_C(b) > 0 \\ N_{bw} - 1, & \text{else} \end{cases}$$

The parameter bandwidth $P_{bw}$ (bandwidth selection information) may be used to control the TNS and the noise filling tool, e.g., at the decoder and embody the signal 39a. The parameter $P_{bw}$ may be stored and/or transmitted in a bitstream using the number of bits nbits$_{bw}$. Notably, the number of bits is not necessarily constant and may vary according to the chosen sample rate $f_s$, hence, reducing the payload for the bitstream where not necessary.

A table such as the following one may be used:

TABLE 1

| $f_s$ | $N_{bw}$ | $I_{bw\_start}$ | $I_{bw\_stop}$ | Bandwidth ($P_{bw}$) 39a | nbits$_{bw}$ |
|---|---|---|---|---|---|
| 8000 | 0 | — | — | {NB} | 0 |
| 16000 | 1 | {53, 0, 0, 0} | {63, 0, 0, 0} | {NB, WB} | 1 |
| 24000 | 2 | {47, 59, 0, 0} | {56, 63, 0, 0} | {NB, WB, SSWB} | 2 |
| 32000 | 3 | {44, 54, 60, 0} | {52, 59, 63, 0} | {NB, WB, SSWB, SWB} | 2 |
| 48000 | 4 | {41, 51, 57, 61} | {49, 55, 60, 63} | {NB, WB, SSWB, SWB, FB} | 3 |

$f_s$ is a given sampling rate (e.g., 8 KHz, 16 KHz, 24 KHz, 32 KHz, and/or 48 KHz) and, for each $f_s$, the number of possible modes is $N_{bw}+1$.

Therefore, it is possible to 0 data encode a control data field including:
 0 data bits corresponding to (signalling the choice of) NB bandwidth;
 1 data bit corresponding to (signalling the choice of one of) NB and WB bandwidth;
 2 data bits corresponding to (signalling the choice of one of) NB, WB, and SSWB bandwidth;
 2 data bits corresponding to (signalling the choice of one of) NB, WB, SSWB, and SWB bandwidth;
 3 data bits corresponding to (signalling the choice of one of) NB, WB, SSWB, SWB, and FB bandwidth.

An electronic version of at least some portions of Table 1 may be stored in the encoder and/or encoder. Accordingly, when the parameter bandwidth $P_{bw}$, it is possible to automatically know control information for the TNS and noise filling operations. For example, $I_{bw\_start}$ may refer to the start index associated to the lower end of the bandwidth $I_{bw\_stop}$ may refer to the final index associated to the higher end of the bandwidth. The bandwidth choice and parameters based on this choice may, therefore, derived from a table such as Table 1.

In examples, when $f_s = 8000$, the bandwidth detector is not needed and we have $P_{bw} = 0$ and nbits$_{bw} = 0$, i.e. the parameter $P_{bw}$ is not placed in the bitstream. However, the decoder will understand that the chosen bandwidth is NB (e.g., on the basis of electronic instruments such as an electronic version of Table 1).

Other methods may be used. One of the bandwidths NB, WB, SSWB, SWB, FB may be identified and transmitted to the FD tools of the encoder subgroup, such as the TNS shaping tool 33 and the noise estimator tool 36. Information such as the parameter $P_{bw}$ (39a) may be encoded and transmitted to the decoder apparatus 40 or 40a, so that the decoder noise estimator tool 43 and the TNS decoder tool 45 make use of the information regarding the selected bandwidth.

In general terms, the information signal characteristics which constitute the basis for the selection of the bandwidth may comprise, inter alia, one or more of the signal bandwidth, at least one energy estimation of the information signal, cut-off characteristics on the spectrum, information on the detection of quietness in some particular bands, $F_Q(bw)$, etc.

The examples above permit to obtain a soft bandwidth switching.

5.2 MDCT or MDST (or Other Transform) at the Encoder

A modified discrete cosine transform (MDCT) or modified discrete sine transform (MDST) (or another modulated lapped transform) tool 31 may convert a digital representation in the TD into a digital representation in the FD. Other examples (maybe based on other transformations, such as lapped transformations) may be notwithstanding used. An example is provided here.

The input signal x(n) of a current frame b in the TD may consist of $N_F$ audio samples, where the newest one is located at $x(N_F - 1)$. Audio samples of past frames are accessed by negative indexing, e.g. x(-1) is the newest of the previous frame.

The time input buffer for the MDCT t may be updated according to $t(n)=x(Z-N_F+n)$ for $n=0 \ldots 2N_F-1-Z$ $t(2N_F-Z+n)=0$ for $n=0 \ldots Z-1$ (initialization may be used only for consistency)

A block of $N_F$ time samples may be transformed to the frequency coefficients $X(k)$ using the following equation:

$$X(k) = \sqrt{\frac{2}{N_F}} \sum_{n=0}^{2N_F-1} w_N(n) \cdot t(n) \cos\left[\frac{\pi}{N_F}\left(n + \frac{1}{2} + \frac{N_F}{2}\right)\left(k + \frac{1}{2}\right)\right] \text{ for } k = 0 \ldots N_F - 1$$

where $w_N$ is the Low Delay MDCT window according to the used frame size. The window may be optimized for $N_F=480$ and other versions for different frame sizes may be generated by means of interpolation. The window shape may be the result of an optimization procedure and may be provided point by point.

It is also possible to apply MDST or other transformations.

5.3.1 LPC at the Encoder

A linear predictive coding (LPC) analysis may be performed by an LPC tool 32. LPC is a used representing the spectral envelope of a digital signal in compressed form, using the information of a linear predictive model.

An LPC filter may be derived in a warped frequency domain and therefore psychoacoustically optimized. To obtain the autocorrelation function, the Energy $E_B(b)$, as defined above, may be pre-emphasized by $$E_{Pre}(b) = E_B(b) \cdot 10^{\frac{b \cdot g_{tilt}}{10(N_B-1)}} \text{ for } b = 0 \ldots N_B - 1$$

where

| $f_s$ | $g_{tilt}$ |
|---|---|
| 16000 | 18 |
| 24000 | 22 |
| 32000 | 26 |
| 48000 | 30 | and transformed to time domain using, for example, an inverse odd DFT $$R_{Pre}(n) = \text{Re}\left(\sum_{b=0}^{N_B-1} E_{Pre}(b) \cdot e^{j\frac{\pi n}{N_B}(b+\frac{1}{2})}\right) \text{ for } n = 0 \ldots N_B - 1$$

$$R_{Pre}(0) = R_{Pre}(0) * 1.0001$$

In case $R_{Pre}(0)=0$, set $R_{Pre}(0)=1$ and $R_{Pre}(1 \ldots N_B-1)=0$. The first $N_L$ samples are extracted into the vector $R_L=R_{Pre}(0 \ldots N_L-1)$, where $N_L$ stands for the LP filter order, i.e. $N_L=16$.

The LP filter coefficients may be calculated, for example, based on the vector $R_L$ through the Levinson-Durbin procedure. This procedure may be described by the following pseudo code:

```
e = R_L(0)
a^0(0) = 1
for k = 1 to N_L do rc = (-∑_{n=0}^{k-1} a^{k-1}(n) R_L(k-n)) / e a^k(0) = 1
    for n = 1 to k - 1 do
        a^k(n) = a^{k-1}(n) + rc · a^{k-1}(k - n)
    a^k(k) = rc
    e = (1 - rc^2)e
``` with $a(k)=a^{N_L}(k)$, $k=0 \ldots N_L$ are the estimated LPC coefficients and e is the prediction error.

The LPC coefficients may be weighted, in examples, by equation such as:

$a_w(k) = a(k) \cdot 0.94^k$ for $k=0 \ldots N_L$

The LPC coefficients may be quantized.

For example, the weighted LPC coefficients $a_w(k)$ are first convolved with the coefficients $b(i)$ using $$a_c(k) = \sum_{i=0}^{2} a'_w(k-i) b(i) \text{ for } k = 0 \ldots N_L + 2$$

with $$a'_w(k) = \begin{cases} a_w(k) & \text{if } 0 \leq k \leq N_L \\ 0 & \text{otherwise} \end{cases}$$

and $$b(i) = \begin{cases} \sum_{k=0}^{N_L} a_w(k) - \sum_{k=0}^{N_L} (-1)^k a_w(k) & \text{if } i = 0 \text{ or } i = 2 \\ -2\left(\sum_{k=0}^{N_L} a_w(k) + \sum_{k=0}^{N_L} (-1)^k a_w(k)\right) & \text{if } i = 1 \end{cases}$$

The coefficients $a_c(k)$ may then be transformed to the frequency domain using $$A(k) = \sum_{n=0}^{N_L+2} a_c(n) e^{\frac{-i2\pi k\left(n - \frac{N_L+1+2}{2}\right)}{N_T}} \text{ for } k = 0 \ldots N_T - 1$$

where $N_T=256$ is the transform length. Note that this transform can be efficiently implemented using a pruned FFT. The real and imaginary parts of $A(k)$ are then extracted $A_r(k) = \text{Re}(A(k))$ for $k = 0 \ldots \frac{N_T}{2}$ $A_i(k) = \text{Im}(A(k))$ for $k = 0 \ldots \frac{N_T}{2}$ LSFs may be obtained by a zero-crossing search of $A_r(k)$ and $A_i(k)$ that can be described with the following pseudo-code

```
specix = 1;
lsfix = 0;
while ((specix <= 128) && lsfix <= 15)
```

```
{
  while (specix <= 128 && A_r[specix-1]* A_r[specix] >= 0)
  {
    specix++;
  }
  if (specix <= 128)
  {
    tmp = specix-1 + A_r[specix-1]/( A_r[specix-1]- A_r[specix]);
    lsf[lsfix++] = tmp/128;
  }
  while (specix <= 128 && A_i[specix-1]* A_i[specix] >= 0)
  {
    specix++;
  }
  if (specix <= 128)
  {
    tmp = specix-1 + A_i[specix-1]/(A_i[specix-1]-A_i[specix]);
    lsf[lsfix++] = tmp/128;
  }
}
```

If less than 16 LSFs are found, the LSFs are set according to $$lsf(k) = \frac{k+1}{N_L+1} \text{ for } k = 0 \ldots N_L - 1$$

An LPC shaping may be performed in the MDCT or MDST (FD) domain by applying gain factors computed from the weighted and quantized LP filter coefficients transformed to the MDCT or MDST spectrum.

To compute $N_B=64$ LPC shaping gains, weighted LP filter coefficients a are first transformed into the frequency domain using an odd DFT.

$$G_{LPC}(b) = \sum_{k=0}^{N_L} \tilde{a}(k) \cdot e^{-j\frac{\pi k}{N_B}(b+\frac{1}{2})} \text{ for } b = 0 \ldots N_B - 1$$

LPC shaping gains $g_{LPC}(b)$ may then be obtained as the absolute values of $G_{LPC}(b)$.

$g_{LPC}(b)=|G_{LPC}(b)|$ for $b=0 \ldots N_B-1$

The LPC shaping gains $g_{LPC}(b)$ may be applied on the MDCT or MDST frequency lines for each band separately in order to generate the shaped spectrum $X_s(k)$ as outlined by the following code.

```
for b=0 to N_B - 1 do
  for k=I_fs(b) to I_fs(b + 1) - 1
    X_s(k) = X(k) · g_LPC(b)
```

As can be seen from above, the LPC tool, for performing the LPC analysis, is not controlled by the controller 39: for example, there is no selection of a particular bandwidth.

5.3.2 SNS at the Encoder

With reference to FIG. 4a, it is possible to use a spectral noise shaper tool 32a.

Spectral noise shaping (SNS) shapes the quantization noise in the frequency domain such that it is minimally perceived by the human ear, maximizing the perceptual quality of the decoded output.

Spectral noise shaping may be performed using, for example, 16 scaling parameters. These parameters may be obtained in the encoder by first computing the energy of the MDCT (or MDST, or another transform) spectrum in 64 non-uniform bands, then by applying some processing to the 64 energies (smoothing, pre-emphasis, noise-floor, log-conversion), then by downsampling the 64 processed energies by a factor of 4 to obtain 16 parameters which are finally normalized and scaled. These 16 parameters may be then quantized using vector. The quantized parameters may then be interpolated to obtain 64 interpolated scaling parameters. These 64 scaling parameters are then used to directly shape the MDCT (or MDST . . . ) spectrum in the 64 non-uniform bands. The scaled MDCT (or MDST . . . ) coefficients may then be quantized using a scalar quantizer with a step size controlled by a global gain. At the decoder, inverse scaling is performed in every 64 bands, shaping the quantization noise introduced by the scalar quantizer. An SNS technique here disclosed may use, for example, only 16+1 parameters as side-information and the parameters can be efficiently encoded with a low number of bits using vector quantization. Consequently, the number of side-information bits is reduced, which may lead to a significant advantage at low bitrate and/or low delay. A non-linear frequency scaling may be used. In this examples, none of the LPC-related functions are used to reduce complexity. The processing functions involved (smoothing, pre-emphasis, noise-floor, log-conversion, normalization, scaling, interpolation) need very small complexity in comparison. Only the vector quantization still has relatively high complexity. However, some low complexity vector quantization techniques can be used with small loss in performance (multi-split/multi-stage approaches). This SNS technique is not relying on a LPC-based perceptual filter. It uses 16 scaling parameters which can be computed with a lot of freedom. Flexibility is therefore increased.

At the encoder 30a, the SNS tool 32 may perform at least one of the following passages:

Step 1: Energy Per Band

The energy per band $E_B(n)$ may be computed as follows $$E_B(b) = \sum_{k=Ind(b)}^{Ind(b+1)-1} \frac{X(k)^2}{Ind(b+1) - Ind(b)} \text{ for } b = 0 \ldots N_B - 1$$

with X(k) are the MDCT (or MDST, or another transform) coefficients, $N_B=64$ is the number of bands and $I_{f_s}(n)$ are the band indices. The bands may be non-uniform and follow the perceptually-relevant bark scale (smaller in low-frequencies, larger in high-frequencies).

Step 2: Smoothing

The energy per band $E_B(b)$ is smoothed using $$E_S(b) = \begin{cases} 0.75 \cdot E_B(0) + 0.25 \cdot E_B(1), & \text{if } b = 0 \\ 0.25 \cdot E_B(62) + 0.75 \cdot E_B(63), & \text{if } b = 63 \\ 0.25 \cdot E_B(b-1) + 0.5 \cdot E_B(b) + 0.25 \cdot E_B(b+1), & \text{otherwise} \end{cases}$$

This step may be mainly used to smooth the possible instabilities that can appear in the vector $E_B(b)$. If not smoothed, these instabilities are amplified when converted to log-domain (see step 5), especially in the valleys where the energy is close to 0.

Step 3: Pre-Emphasis

The smoothed energy per band $E_S(b)$ is then pre-emphasized using $$E_P(b) = E_S(b) \cdot 10^{\frac{b \cdot g_{tilt}}{10 \cdot 63}} \quad \text{for } b = 0 \ldots 63$$

with $g_{tilt}$ controls the pre-emphasis tilt and depends on the sampling frequency. It is for example 18 at 16 kHz and 30 at 48 kHz. The pre-emphasis used in this step has the same purpose as the pre-emphasis used in the LPC-based perceptual filter of conventional technology, it increases the amplitude of the shaped Spectrum in the low-frequencies, resulting in reduced quantization noise in the low-frequencies.

Step 4: Noise Floor

A noise floor at −40 dB is added to $E_P(b)$ using $$E_p = \max(E_p(b), \text{noiseFloor}) \text{ for } b = 0 \ldots 63$$

with the noise floor being calculated by $$\text{noiseFloor} = \max\left(\frac{\sum_{b=0}^{63} E_P(b)}{64} \cdot 10^{-\frac{40}{10}}, 2^{-32}\right)$$

This step improves quality of signals containing very high spectral dynamics such as e.g. glockenspiel, by limiting the amplitude amplification of the shaped spectrum in the valleys, which has the indirect effect of reducing the quantization noise in the peaks (an increase of quantization noise in the valleys is not perceptible).

Step 5: Logarithm

A transformation into the logarithm domain is then performed using $$E_L(b) = \frac{\log_2(E_P(b))}{2} \quad \text{for } b = 0 \ldots 63$$

Step 6: Downsampling

The vector $E_L(b)$ is then downsampled by a factor of 4 using $$E_4(b) = \begin{cases} w(0)E_L(0) + \sum_{k=1}^{5} w(k)E_L(4b+k-1) & \text{if } b = 0 \\ \sum_{k=0}^{4} w(k)E_L(4b+k-1) + w(5)E_L(63) & \text{if } b = 15 \\ \sum_{k=0}^{5} w(k)E_L(4b+k-1) & \text{otherwise} \end{cases}$$

with $$w(k) = \left\{\frac{1}{12}, \frac{2}{12}, \frac{3}{12}, \frac{3}{12}, \frac{2}{12}, \frac{1}{12}\right\}$$

This step applies a low-pass filter (w(k)) on the vector $E_L(b)$ before decimation. This low-pass filter has a similar effect as the spreading function used in psychoacoustic models: it reduces the quantization noise at the peaks, at the cost of an increase of quantization noise around the peaks where it is anyway perceptually masked.

Step 7: Mean Removal and Scaling

The final scale factors are obtained after mean removal and scaling by a factor of 0.85

$$scf(n) = 0.85\left(E_4(n) - \frac{\sum_{b=0}^{15} E_4(b)}{16}\right) \quad \text{for } n = 0 \ldots 15$$

Since the codec has an additional global-gain, the mean can be removed without any loss of information. Removing the mean also allows more efficient vector quantization. The scaling of 0.85 slightly compress the amplitude of the noise shaping curve. It has a similar perceptual effect as the spreading function mentioned in Step 6: reduced quantization noise at the peaks and increased quantization noise in the valleys.

Step 8: Quantization

The scale factors are quantized using vector quantization, producing indices which are then packed into the bitstream and sent to the decoder, and quantized scale factors scfQ(n).

Step 9: Interpolation

The quantized scale factors scfQ(n) are interpolated using:

scfQint(0)=scfQ(0)

scfQint(1)=scfQ(0)

scfQint(4n+2)=scfQ(n)+⅛(scfQ(n+1)−scfQ(n)) for n=0 ... 14 scfQint(4n+3)=scfQ(n)+⅜(scfQ(n+1)−scfQ(n)) for n=0 ... 14 scfQint(4n+4)=scfQ(n)+⅝(scfQ(n+1)−scfQ(n)) for n=0 ... 14 scfQint(4n+5)=scfQ(n)+⅞(scfQ(n+1)−scfQ(n)) for n=0 ... 14 scfQint(62)=scfQ(15)+⅛(scfQ(15)−scfQ(14))

scfQint(63)=scfQ(15)+⅜(scfQ(15)−scfQ(14))

and transformed back into linear domain using $$g_{SNS}(b) = 2^{scfQint(b)} \text{ for } b=0 \ldots 63$$

Interpolation may be used to get a smooth noise shaping curve and thus to avoid any big amplitude jumps between adjacent bands.

Step 10: Spectral Shaping

Figure 7:
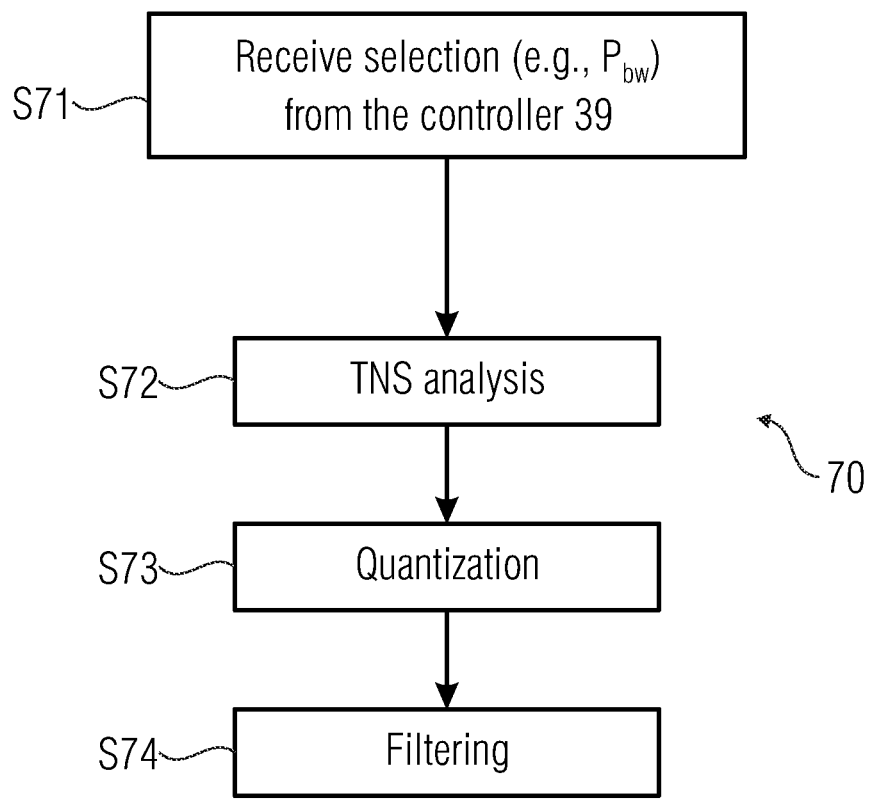
FIG. 7 shows a method for TNS at the encoder according to an example.

The SNS scale factors $g_{SNS}(b)$ are applied on the MDCT (or MDST, or another transform) frequency lines for each band separately in order to generate the shaped spectrum $X_s(k)$ $$X_s(k) = \frac{X(k)}{g_{SNS}(b)}$$

for $k = I_{f_s}(b) \ldots I_{f_s}(b+1) - 1$, for $b = 0 \ldots 63$ 5.4 TNS at the Encoder FIG. 7 shows a method 70 indicating operations of a TNS tool such as the TNS tool 33 of the encoder 30 or 30a.

At step S71, selection information regarding the selected bandwidth (e.g., parameter $P_{bw}$) may be obtained from the encoder bandwidth detector and controller 39, for example.

According to the selection information (bandwidth information), the behaviour of the TNS is different for different bandwidths (NB, WB, SSWB, SWB, FB). An example is provided by the following table:

TABLE 2

| Band-width | num_tns_filters | start_freq(f) | stop_freq(f) | sub_start(f, s) | sub_stop(f, s) |
|---|---|---|---|---|---|
| NB | 1 | {12} | {80} | {{12, 34, 57}} | {{34, 57, 80}} |
| WB | 1 | {12} | {160} | {{12, 61, 110}} | {61, 110, 160}} |
| SSWB | 1 | {12} | {240} | {{12, 88, 164}} | {88, 164, 240}} |
| SWB | 2 | {12, 160} | {160, 320} | {12, 61, 110}, {160, 213, 266}} | {61, 110, 160}, {213, 266, 320}} |
| FB | 2 | {12, 200} | {200, 400} | {12, 74, 137}, {200, 266, 333}} | {74, 137, 200}, {266, 333, 400}} |

For example, when the selection information is SWB, the TNS will perform a filtering twice (see num_tns_filters). As can be seen from the tables, different indexes are associated to different bandwidths (e.g., for NB the stop frequency is different than for WB, and so on).

Therefore, as can be seen, the TNS tool 33 may operate at a different bandwidth on the basis of the selection set out by the controller 39. Notably, other FD tools of the same encoder apparatus 40 or 40a may continue perform processes at a different frequency.

The TNS encoding steps are described below. First, an analysis estimates a set of reflection coefficients for each TNS Filter (step S72). Then, these reflection coefficients are quantized (step S73). And finally, the MDCT- or MDST-spectrum is filtered using the quantized reflection coefficients (step S73).

With reference to the step S72, a complete TNS analysis described below may be repeated for every TNS filter f, with f=0 . . . num_tns_filters−1 (num_filters is given in Table 2). Other TNS analysis operations may be performed, which provide reflection coefficients.

The TNS tool may be configured to perform an autocorrelation on a TNS input value. A normalized autocorrelation function may be calculated as follows, for each k=0 . . . 8 (for example)

$$r(k) = \begin{cases} r_0(k), & \text{if } \prod_{s=0}^{2} e(s) = 0 \\ \sum_{s=0}^{2} \frac{\sum_{n=sub\_start(f,s)}^{sub\_stop(f,s)-1-k} X_s(n)X_s(n+k)}{e(s)}, & \text{otherwise} \end{cases}$$

with $$r_0(k) = \begin{cases} 1, & \text{if } k = 0 \\ 0, & \text{otherwise} \end{cases}$$

and $$e(s) = \sum_{n=sub\_start(f,s)}^{sub\_stop(f,s)-1} X_s(n)^2 \text{ for } s = 0 \dots 2$$

with sub_start(f,s) and sub_stop(f,s) given Table 2. e (s) is an energy sum over a spectral subsection (a normalization factor between the start and the stop frequency of each filter).

The normalized autocorrelation function may be lag-windowed using, for example:

$$r(k) = r(k)\exp\left[-\frac{1}{2}(0.02\pi k)^2\right] \text{ for } k = 0 \dots 8$$

In some examples, it is possible to perform a decision to turn on/off the TNS filter fin the current frame is based on the prediction gain If predGain>thresh, then turn on the TNS filter f with thresh=1.5 and the prediction gain may be computed by $$predGain = \frac{r(0)}{e}$$

The additional steps described below are performed only if the TNS filter f is turned on (or in the example which do not use the turning on/off).

In some examples, a weighting factor may be computed by $$\gamma = \begin{cases} 1 - (1 - \gamma_{min})\frac{thresh2 - predGain}{thresh2 - thresh}, & \text{if tns\_lpc\_weighting} = 1 \text{ and } predGain < thresh2 \\ 1, & \text{otherwise} \end{cases}$$

with thresh2=2, $\gamma_{min}$=0.85 and $$\text{tns\_lpc\_weighting} = \begin{cases} 1, & \text{if } nbits < 480 \\ 0, & \text{otherwise} \end{cases}$$

The LPC coefficients may be weighted using the factor γ
$a_w(k) = \gamma^k a(k)$ for $k=0 \dots 8$ The weighted LPC coefficients may be converted to reflection coefficients using the following procedure:

$$a^K(k) = a_w(k), k = 0, \dots, K$$

for $k = K$ to 1 do $rc(k) = a^k(k)$ $e = (1 - rc(k)^2)$ for $n = 1$ to $k - 1$ do $$a^{k-1}(n) = \frac{a^k(n) - rc(k)a^k(k-n)}{e}$$

wherein rc(k,f)=rc(k) are the final estimated reflection coefficients for the TNS filter f.

If the TNS filter f is turned off, then the reflection coefficients may be simply set to 0: rc(k,f)=0, k=0 . . . 8.

At step S73, a quantization step may be performed. For example, for each TNS filter f, reflection coefficients (e.g., as obtained at step S72) may quantized. For example, scalar uniform quantization in the arcsine domain may be used:

$$rc_i(k, f) = nint\left[\frac{\arcsin(rc(k, f))}{\Delta}\right] + 8 \quad \text{for } k = 0 \ldots 8$$

and/or $$rc_q(k,f) = \sin[\Delta(rc_i(k,f)-8)] \text{ for } k=0 \ldots 8$$

with $$\Delta = \frac{\pi}{17}$$

and nint(.) being the rounding-to-nearest-integer function, for example; $rc_i(k,f)$ the quantizer output indices; and $rc_q$ (k,f) the quantized reflection coefficients.

An order of the quantized reflection coefficients may be calculated using k=7 while k≥0 and $rc_q(k,f)=0$ do k=k−1

$rc_{order}(f)=k+1$

A total number of bits consumed by TNS in the current frame may be computed as follows $$nbits_{TNS} = \left\lceil \sum_{f=0}^{num\_tns\_filters-1} \frac{2048 + nbits_{TNS_{order}}(f) + nbits_{TNS_{rc}}(f)}{2048} \right\rceil$$

with $$nbits_{TNS_{order}}(f) = \begin{cases} ac\_tns\_order\_bits[tns\_lpc\_weighting][rc_{order}(f)-1], & \text{if } rc_{order}(f) > 0 \\ 0, & \text{otherwise} \end{cases}$$

and/or $$nbits_{TNS_{coef}}(f) = \begin{cases} \sum_{k=0}^{rc_{order}(f)-1} ac\_tns\_coef\_bits[k][rc_i(k, f)], & \text{if } rc_{order}(f) > 0 \\ 0, & \text{otherwise} \end{cases}$$

⌈ . . . ⌉ means a rounding operation to the integer over.

The tables tab_nbits_TNS_order and tab_nbits_TNS_coef may be pre-defined.

At step S74, a digital representation of an information signal in the FD (e.g., as provided by the LPC tool 32 or SNS tool 32a) may be filtered. This representation may be, in examples, in the form of a modified discrete cosine or sine transform (MDCT or MDST). The MDCT spectrum $X_s(n)$ may filtered using the following algorithm, for example:

$s^0(\text{start\_freq}(0)-1) = s^1(\text{start\_freq}(0)-1) = \ldots = s^7(\text{start\_freq}(0)-1) = 0$ for f=0 to num_tns_filters−1 do
for n=start_freq(f) to stop_freq(t)−1 do $t^0(n) = s^0(n) = X_s(n)$ for k=7 to 0 do $t^{k+1}(n) = t^k(n) + rc_q(k)s^k(n-1)$ $s^{k+1}(n) = rc_q(k)t^k(n) + s^k(n-1)$ $X_f(n) = t^8(n)$ where $X_f(n)$ is the TNS filtered MDCT or MDST spectrum.

Other filtering techniques may be used. However, it may be seen that the TNS is applied to the particular bandwidth (e.g., NB, WB, SSWB, SWB, FB) chosen by the controller 39 on the basis of the signal characteristics.

5.5 Spectral Quantization at the Encoder

A spectrum quantizer tool 34 is here discussed. The MDCT or MDST spectrum after TNS filtering ($X_f(n)$) may be quantized using dead-zone plus uniform threshold scalar quantization and the quantized MDCT or MDST spectrum $X_q(n)$ may then be encoded using arithmetic encoding. A global gain gg may control the step size of the quantizer. This global gain is quantized with 7 bits and the quantized global gain index $gg_{ind}$ is then an integer, for example, between 0 and 127. The global gain index may be chosen such that the number of bits needed to encode the quantized MDCT or MDST spectrum is as close as possible to the available bit budget.

In one example, a number of bits available for coding the spectrum may be given by $$nbits_{spec} = nbits - nbits_{bw} - nbits_{TNS} - \\ nbits_{LTPF} - nbits_{LPC/SNS} - nbits_{gain} - nbits_{nf} - \left\lceil \log_2\left(\frac{N_E}{2}\right) \right\rceil - 1$$

with nbits being the number of bits available in one TD frame for the original information signal, $nbits_{bw}$ provided in Table 1, $nbits_{TNS}$ provided by the TNS (total number of bits consumed by TNS in a current frame), $nbits_{LTPF}$ being associated to the LTPF 38b (number of bits consumed by LTPF), $nbits_{LPC/SNS}$=38, $nbits_{gain}$=7 and $nbits_{nf}$=3, for example. In examples, also protection bits (e.g., cyclical redundancy code, CRC, bits) may be taken into consideration.

An offset may first be computed using $$nbits_{offset} = 0.8 * nbits_{offset}^{old} + 0.2 * \min(40, \max(-40, nbits_{offset}^{old} + nbits_{spec}^{old} - nbits_{est}^{old}))$$

with $nbits_{offset}^{old}$ is the value of $nbits_{offset}$ in the previous frame, $nbits_{spec}^{old}$ is the value of $nbits_{spec}$ in the previous frame and $nbits_{est}^{old}$ is the value of $nbits_{est}$ in the previous frame.

This offset may then be used to adjust the number of bits available for coding the spectrum $$nbits_{spec} = nint(nbits_{spec} + nbits_{offset})$$

A global gain index may then be estimated such that the number of bits needed to encode the quantized MDCT or MDST spectrum is as close as possible to the available bit budget. This estimation is based on a low-complexity bisection search which coarsely approximates the number of bits needed to encode the quantized spectrum. The algorithm can be described as follows

```
fac = 128;
gg_ind = 127;
for (iter = 0; iter < 7; iter++)
{
   fac >>= 1;
   gg_ind -= fac;
   tmp = 0;
   for (i = 0; i < N_E/4; i++)
   {
     if (E[i]*28/20 <gg_ind)
     {
        tmp += 2.7*28/20;
     }
     else
     {
        tmp += E[i]*28/20 - gg_ind + 7*28/20;
     }
   }
   if (tmp > nbits_spec * 1.4*28/20)
   {
      gg_ind += fac;
   }
}
``` with E[k] being the energy (in dB) of blocks of 4 MDCT or MDST coefficients given by $$E(k) = 10 * \log_{10}\left(\sum_{n=0}^{3} X_f(4*k+n)^2\right) \text{ for } k = 0 \ldots \frac{N_E}{4}$$

The global gain index above is first unquantized using $$gg = 10^{\frac{gg_{ind}}{28}}$$

The spectrum $X_f$ may then be quantized using, for example:

$$X_q(n) = \begin{cases} \min\left(\left\lfloor \frac{X_f(n)}{gg} + 0.375 \right\rfloor, 32767\right), & \text{if } X_f(n) \geq 0 \\ \max\left(\left\lceil \frac{X_f(n)}{gg} - 0.375 \right\rceil, -32768\right), & \text{otherwise} \end{cases}$$

The number of bits $nbits_{est}$ needed to encode the quantized MDCT or MDST (or, anyway, FD) spectrum $X_q(n)$ can be accurately estimated using the algorithm below.

A bitrate flag is first computed using, for example:

```
get_rateFlag(f_s, nbits)
if (nbits > (160 + min(4,(f_s/8000-1)) * 160))
{
   rateFlag =512;
}
else
{
   rateFlag = 0;
}
return rateFlag;
```

Then the index of the last non-zeroed 2-tuple is obtained by

```
get_lastnz(Xq[ ], N_E)
lastnz = N_E;
while (lastnz>2 && X_q[lastnz-1] == 0 && X_q[lastnz-2] == 0)
{
   lastnz -= 2;
}
return lastnz;
```

The number of bits $nbits_{est}$ may be then computed as follows

```
nbits_est = 0;
c = 0;
for (n = 0; n < lastnz; n++)
{
   t = c + rateFlag;
   if (k > N_E/2)
   {
      t += 256;
   }
   a = abs(X_q[k]);
   b = abs(X_q[k+1]);
   nbits_est += (min(a,1) + min(b,1)) * 2048;
   lev = 0;
   while (max(a,b) >= 4)
   {
      pki = ac_spec_lookup[t+lev*1024];
      nbits_est += 2*2048 + ac_spec_bits[pki][16];
      a >>= 1;
      b >>= 1;
      lev = min(lev+1,3);
   }
   pki = ac_spec_lookup[t+lev*1024];
   sym = a + 4*b;
   nbits_est += ac_spec_bits[pki][sym];
   if (lev <= 1)
   {
      t= 1 + (a+b)*(lev+1);
   }
   else
   {
      t = 12 + lev;
   }
   c = (c&15)*16 + t;
}
nbits_est = ceil(nbits_est/2048);
``` with ac_lookup and ac_bits are tables which may be predefined.

The number of bits $nbits_{est}$ may be compared with the available bit budget $nbits_{spec}$. If they are far from each other, then the quantized global gain index $gg_{ind}$ is adjusted and the spectrum is requantized. A procedure used to adjust the quantized global gain index $gg_{ind}$ is given below

```
If ((gg_ind < 127 && nbits_est > nbits_spec) ||
    (gg_ind > 0 && nbits_est< nbitsspec - 20))
{
   if (nbits_est < nbits_spec - 20)
   {
      gg_ind -= 1;
   }
   else if (gg_ind == 126 || nbits_est < nbits_spec + 20)
   {
      gg_ind += 1;
   }
   else
   {
      gg_ind += 2;
   }
}
```

As can see from above, the spectral quantization is not controlled by the controller 39: there is no restriction to a particular band.

5.6 Entropy Coding

All or part of the encoded data (TNS data, LTPF data, global gain, quantized spectrum . . . ) may be entropy coded, e.g., by compression according to any algorithm.

A portion of this data may be composed by pure bits which are directly put in the bitstream starting from the end of the bitstream and going backward.

The rest of data may be encoded using arithmetic encoding starting from the beginning of the bitstream and going forward.

The two data fields above may be exchanged regarding starting point and direction of reading/writing of the bit stream.

An example in pseudo code may be:

```
bp = 0;
bp_side = nbytes - 1;
mask_side = 1;
nbits_written = 2 << 11;
c = 0;
lastnz = get_lastnz(X_q, N_E);
rateFlag = get_rateFlag(f_s, nbits);
/* Bandwidth */
if (nbits_bw > 0)
{
   write_uint_backward(bytes, &bp_side, &mask_side, P_bw, nbits_bw);
   nbits_written += nbits_bw << 11;
}
/* Global Gain */
write_uint_backward(bytes, &bp_side, &mask_side, gg_ind, 7);
nbits_written += 7 << 11;
/* Noise Factor */
write_uint_backward(bytes, &bp_side, &mask_side, 0, 3);
nbits_written += 3 << 11;
/* TNS activation flag */
for (f = 0; f < num_tns_filters; f++)
{
   write_bit_backward(bytes, &bp_side, &mask_side, min(rc_order(f), 1));
   nbits_written += 1 << 11;
}
/* LTPF data */
write_bit_backward(bytes, &bp_side, &mask_side, pitch_present);
nbits_written += 1 << 11;
if (pitch_present != 0)
{
   write_uint_backward(bytes, &bp_side, &mask_side, pitch_index, 9);
   write_uint_backward(bytes, &bp_side, &mask_side, ltpf_active, 1);
   nbits_written += 10 << 11;
}
/* Env-VQ integer bits */
write_uint_backward(bytes, &bp_side, &mask_side, L_lsf_idx[0], 10 >> 1);
write_uint_backward(bytes, &bp_side, &mask_side, L_lsf_idx[1], 10 >> 1);
write_bit_backward(bytes, &bp_side, &mask_side, lsf_submode_flag);
write_uint_backward(bytes, &bp_side, &mask_side, L_lsf_idx[3], fgBits);
write_bit_backward(bytes, &bp_side, &mask_side, L_lsf_idx[4]);
nbits_written += (12 + fgBits) <<11;
/* Last non-zero tuple */
nbits_lastnz = ceil(log2(N_E/2));
bp_side_lastnz = bp_side;
mask_side_lastnz = mask_side;
write_uint_backward(bytes, &bp_side_lastnz, &mask_side_lastnz, (lastnz >> 1) - 1, nbits_lastnz);
nbits_written += nbits_lastnz << 11;
```

5.7 Noise Estimation at the Encoder

A noise estimation tool 36 (noise level estimator) may control the noise filing on the decoder side. At the encoder side, the noise level parameter may be estimated, quantized and transmitted or stored in a bitstream.

The noise level may be estimated based on the spectral coefficients which have been quantized to zero, i.e. $X_q(k)=0$. The indices for the relevant spectral coefficients are given by $$I_{NF}(k) = \begin{cases} 1 & \text{if } 24 \leq k < bw_{stop} \text{ and} \\ & X_q(i) == 0 \text{ for all } i = k-3 \ldots \min(bw\_stop, k+3) \\ 0 & \text{otherwise} \end{cases}$$

where $bw_{stop}$ may depend on the bandwidth detected at step S62 and/or by the bandwidth detector and controller 39 as defined, for example, in the following table:

TABLE 3

|  | Bandwidth($P_{bw}$, 39a) | | | | |
| --- | --- | --- | --- | --- | --- |
|  | NB | WB | SSWB | SWB | FB |
| bw_stop | 80 | 160 | 240 | 320 | 400 |

For the identified indices, the mean level of missing coefficients is estimated based on the spectrum after TNS filtering ($X_f(k)$), for example, and normalized by the global gain.

$$L_{NF} = \frac{\sum_{k=0}^{N_E-1} I_{NF}(k) \cdot \frac{|X_f(k)|}{gg}}{\sum_{k=0}^{N_E-1} I_{NF}(k)}$$

The final noise level may be quantized to eight steps:

$$F_{NF} = \min(\max(\lfloor 8 - 16 \cdot L_{NF} \rfloor, 0), 7)$$

Therefore, the noise level estimator tool 36 may be controlled by the controller 39, e.g., on the basis of bandwidth information 39a.

For example, an electronic version of Table 3 may be stored in a storage unit so that, when the bandwidth selection for a particular bandwidth is obtained, the parameter $bw_{stop}$ is easily derived.

5.8 Entropy Decoding at the Decoder

All the encoded data (TNS data, LTPF data, global gain, quantized spectrum . . . ) may be entropy decoded at the decoder side, e.g., using the decoder tool 42. A bitstream provided by an encoder may, therefore, be decompressed according to any algorithm.

5.9 Noise Filling at the Decoder

A decoder noise filling tool 43 is here discussed. The decoder noise filling tool 43 may be controlled, inter alia, by the decoder bandwidth controller 49 (and/or by the controller 39 via information 39a encoded in the bitstream, such as the control data field $N_{bw}$ and/or $P_{wb}$ of Table 1).

The indices for the relevant spectral coefficients may be given by $$I_{NF}(k) = \begin{cases} 1 & \text{if } 24 \le k < bw_{stop} \text{ and} \\ & \overline{X_q}(i) == 0 \text{ for all } i = k-3 \ldots \min(bw_{stop}, k+3) \\ 0 & \text{otherwise} \end{cases}$$

where $bw_{stop}$ may be given in Table 3.

The noise filling may be applied on the identified relevant spectral lines $I_{NF}(k)$ using a transmitted noise factor $F_{NF}$ obtained from the encoder. $F_{NF}$ may be calculated at the noise estimator on encoder side. $F_{NF}$ may be a 3 bit value coded as side information in the bit stream. $F_{NF}$ may be obtained, for example, using the following procedure:

```
/* Bandwidth */
if (nbits_bw > 0)
{
  P_bw = read_uint(bytes, &bp_side, &mask_side, nbits_bw),
}
else
{
  P_bw = 0;
}
/* Global Gain */
gg_ind = read_uint(bytes, &bp_side, &mask_side, 7);
/* Noise Level */
F_NF = read_uint(bytes, &bp_side, &mask_side, 3);
/* TNS activation flag */
if (P_bw < 3)
{
  num_tns_filters = 1;
}
else
{
  num_tns_filters = 2;
}
for(f = 0; f < num_tns_filters; f++)
{
  rc_order(f) = read_bit(bytes, &bp_side, &mask_side);
}
/* LTPF data */
pitch_present = read_bit(bytes, &bp_side, &mask_side);
if (pitch_present != 0)
{
  pitch_index = read_uint(bytes, &bp_side, &mask_side, 9);
  ltpf_active = read_uint(bytes, &bp_side, &mask_side, 1);
}
else
{
    pitch_index = 0;
    ltpf_active = 0;
}
/* LSF-VQ integer bits */
L_lsf_idx[0] = read_uint(bytes, &bp_side, &mask_side, 10 >> 1);
L_lsf_idx[1] = read_uint(bytes, &bp_side, &mask_side, 10 >> 1);
lsf_submode_flag = read_bit(bytes, &bp_side, &mask_side);
L_lsf_idx[3] = read_uint(bytes, &bp_side, &mask_side, fgBits);
L_lsf_idx[4] = read_bit(by(es, &bp_side, &mask_side);
/* Last non-zero tuple */
nbits_lastnz = ceil(log2(N_E/2));
lastnz = read_uint(bytes, &bp_side, &mask_side, nbits_lastnz);
lastnz = (lastnz + 1) << 1;
```

A procedure is here provided:

```
L_NF = (8-F_NF)/16;
for k=0.. bw_stop-1
   if I_NF(k)==1
      nf_seed = (13849+nf_seed*31821) & 0xFFFF;
      if nf_seed>=0x8000
         X_q(k) = L_NF;
      else
         X_q(k) = -L_NF;
```

How to obtain the nf_seed may be described, for example, by the following pseudocode:

```
{
   X_q[k] = 0;
}
/* Noise Filling Seed */
tmp = 0;
for (k = 0; k < N_E; k++)
{
   tmp += abs( X_q[k]) * k;
}
nf_seed = tmp & 0xFFFF;
```

As can be seen from above, the decoder noise filter tool 43 may make use of the parameter $bw_{stop}$.

In some examples, the parameter $bw_{stop}$ explicitly obtained as a value in the bitstream. In examples, the parameter $bw_{stop}$ is obtained by the controller 49 on the basis of the bandwidth information 39a ($P_{bw}$) in a control field of the bitstream encoded by the encoder. The decoder may have an electronic version of Table 3 stored in a non-transitory storage unit. Accordingly, the bitstream length is reduced.

Therefore, the bandwidth controller 49 (and/or the bandwidth detector and controller 39 of the decoder via the control data 39a) may control the decoder noise filling tool 43.

5.9 Global Gain at the Decoder

A global gain may be applied on the spectrum after the noise filling has been applied using, for example, a formula such as $$\hat{X}_f(k) = \overline{X_q}(k) \cdot 10^{\left(\frac{gg_{ind}}{28}\right)} \text{ for } k = 0 \ldots N_E - 1$$

where $gg_{ind}$ is a global gain index, e.g., obtained from the encoder.

5.10 TNS at the Decoder

A TNS decoder tool 45 is here discussed. The quantized reflection coefficients may be obtained for each TNS filter f using $$rc_q(k,f) = \sin[\Delta(rc_i(k,f)-8)] \; k=0 \ldots 8$$

where $rc_i(k,f)$ are the quantizer output indices.

The MDCT or MDST spectrum $\hat{X}_f(n)$ (e.g., as generated by the global gain tool) may then be filtered using a following procedure such as:

```
s^0(start_freq(0) -1) = s^1(start_freq(0) -1) = . . . = s^7(start_freq(0) - 1) = 0
for f = 0 to num_tns_filters-1 do
   for n = start_freq(f) to stop_freq(f) - 1 do
      t^k(n) = X_f(n)
      for k = 7 to 0 do
         t^k(n) = t^{k+1}(n) - rc_q(k)s^k(n - 1)
         s^{k+1}(n) = rc_q(k)t^k(n) + s^k(n -1)
      X_s(n) = s^0(n) = t^0(n)
``` where $\hat{X}_s(n)$ is the output of the TNS decoder.

The parameters num_tns_filters, start_freq and stop_freq may be provided, on the basis of control information provided by the encoder.

In some examples num_tns_filters, start_freq and/or stop_freq are not explicitly provided in the bitstream. In examples, num_tns_filters, start_freq and stop_freq are derived on the basis of the $N_{bw}$ value in a control field of the bitstream encoded by the encoder. For example, the decoder may have an electronic version of Table 2 (or at least a portion thereof) stored therein. Accordingly, the bitstream length is reduced.

Therefore, the TNS decoder tool 45 may be controlled by the bandwidth detected at the encoder side.

5.11.1 MDCT or MDST Shaping at the Decoder

An MDCT or MDST shaping tool 46 is here discussed. The LPC or SNS shaping may be performed in the MDCT (FD) domain by applying gain factors computed from the decoded LP filter coefficients transformed to the MDCT or MDST spectrum.

To compute the $N_B$ LPC shaping gains, the decoded LP filter coefficients ã may be first transformed into the frequency domain using an odd DFT.

$$G_{LPC}(b) = \sum_{k=0}^{N_L} \tilde{a}(k) \cdot e^{-j\frac{\pi k}{N_B}(b+\frac{1}{2})} \text{ for } b = 0 \ldots N_B - 1$$

The LPC shaping gains $g_{LPC}(b)$ may then be computed as the reciprocal absolute values of $G_{LPC}(b)$.

$$g_{LPC}(b) = \frac{1}{|G_{LPC}(b)|} \text{ for } b = 0 \ldots N_B - 1$$

The LPC shaping gains $g_{LPC}(b)$ may be applied on the TNS filtered MDCT frequency lines for each band separately as outlined in order to generate the shaped spectrum $\hat{X}(k)$ as outlined, for example, by the following code:

```
for (b=0; b<N_B; b++) {
    for (k=I_fs(b); k<I_fs(b +1); k++) {
        X̂(k) = X̂_f(k) · g_LPC(b)
    }
}
```

As can be seen above, the MDCT or MDST shaping tool 46 does not need to be restricted to a particular bandwidth and, therefore, does not need to be controlled by the controller 49 or 39.

5.11.2 SNS at the Decoder

The following steps may be performed at the noise shaper decoder, SNS, tool 46a:

Step 1: Quantization

The vector quantizer indices produced in encoder step 8 (see section 5.3.2) are read from the bitstream and used to decode the quantized scale factors scfQ (n).

Step 2: Interpolation

Same as Step 9 at section 5.3.2.

Step 3: Spectral Shaping

The SNS scale factors $g_{SNS}(b)$ are applied on the quantized MDCT (or MDST, or another transform) frequency lines for each band separately in order to generate the decoded spectrum $\hat{X}(k)$ as outlined by the following code:

$\hat{X}(k) = \widehat{X}_s(k) \cdot g_{SNS}(b)$ for $k = I_{fs}(b) \ldots I_{fs}(b+1)-1$,
for $b = 0 \ldots 63$

5.12 MDCT or MDST Synthesis at the Decoder

An inverse MDCT or MDST tool 48a is here discussed (other tools based on other transformations, such as lapped transformations, may be used).

A reconstructed spectrum $\hat{X}(k)$ may be transformed to time domain by the following steps:

1. Generation of time domain aliasing buffer $\hat{t}(n)$ $$\hat{t}(n) = \sqrt{\frac{2}{N_F}} \sum_{k=0}^{N_F-1} \hat{X}(k) \cos\left[\frac{\pi}{N_F}\left(n + \frac{1}{2} + \frac{N_F}{2}\right)\left(k + \frac{1}{2}\right)\right] \text{ for}$$

$n = 0 \ldots 2N_F - 1$

2. Windowing of time-aliased buffer $\hat{t}(n) = w_N(2N-1-n) \cdot \hat{t}(n)$ for $n = 0 \ldots 2N_F-1$ 3. Conduct overlap-add operation to get reconstructed time samples $\hat{x}(n)$ $\hat{x}(n) = \text{mem\_ola\_add}(n) + \hat{t}(Z+n)$ for $n = 0 \ldots N_F-Z-1$ $\hat{x}(n) = \hat{t}(Z+n)$ for $n = N_F-Z \ldots N_F-1$ $\text{mem\_ola\_add}(n) = \hat{t}(N_F+Z+n)$ for $n = 0 \ldots N_F-Z-1$ with mem_ola_add(n) is initialized to 0 before decoding the first frame.

With reference to step 1, an MDST may be performed by exchanging the cos function by a sine function, e.g., to have:

$$\hat{t}(n) = \sqrt{\frac{2}{N_F}} \sum_{k=0}^{N_F-1} \hat{X}(k) \sin\left[\frac{\pi}{N_F}\left(n + \frac{1}{2} + \frac{N_F}{2}\right)\left(k + \frac{1}{2}\right)\right] \text{ for}$$

$n = 0 \ldots 2N_F - 1$

As can be seen above, the inverse MDCT or MDST tool 48a is not controlled on the basis of the bandwidth determined at the encoder side.

6. OTHER EXAMPLES

FIG. 8a shows an apparatus 110 which may implement at least some tools of the encoder apparatus 30 or 30a and/or perform at least some steps of the method 60 and/or 70. The apparatus 110 may comprise a processor 111 and a non-transitory memory unit 112 storing instructions which, when executed by the processor 111, may cause the processor 111 to implement at least one of the TD and/or FD tools of the encoder apparatus 30 or 30a. In particular, the instructions may implement a subgroup of FD tools (e.g., TNS and/or noise filling) and other FD tools which are not in the subgroup (e.g., 31, 32, 34, 35). The instructions may also comprise instructions which, when executed by the processor 111, perform a selection of the bandwidth so that the bandwidth of the signals processed by the tools in the subgroup of FD tools (e.g., TNS and/or noise filling) differs from the bandwidth of the signals processed by the other FD tools which are not in the subgroup (e.g., 31, 32, 34, 35). The instructions may be such as to control the bandwidth selection based on energy detections associated to the different bandwidths. The instructions may also comprise instructions which, when executed by the processor 111, permit to control a decoder and, in particular, permit to control the bandwidth of a subgroup of FD tools (e.g., 43, 45) which may be different from the bandwidth of other FD tools. The bandwidth chosen for the subgroup at the encoder may be the same chosen for the subgroup at the decoder. The non-transitory memory unit 112 may also comprise other data, such as at least portions electronic versions of Tables 1, 2, and/or 3. The apparatus 110 may comprise a storage space 118 for storing, for example, a bitstream obtained from an information signal (e.g., an audio signal). The apparatus 110 may comprise an output unit 117 for transmitting data, e.g., wirelessly, e.g., using a particular protocol, such as Bluetooth. For example, the apparatus 110 may define, by executing the instructions stored in the non-transitory memory unit 112, a bitstream to be transmitted to a decoder. The apparatus 110 may also comprise an input unit 116 for obtaining data, e.g., wirelessly, e.g., using a particular protocol, such as Bluetooth.

Figure 8B:
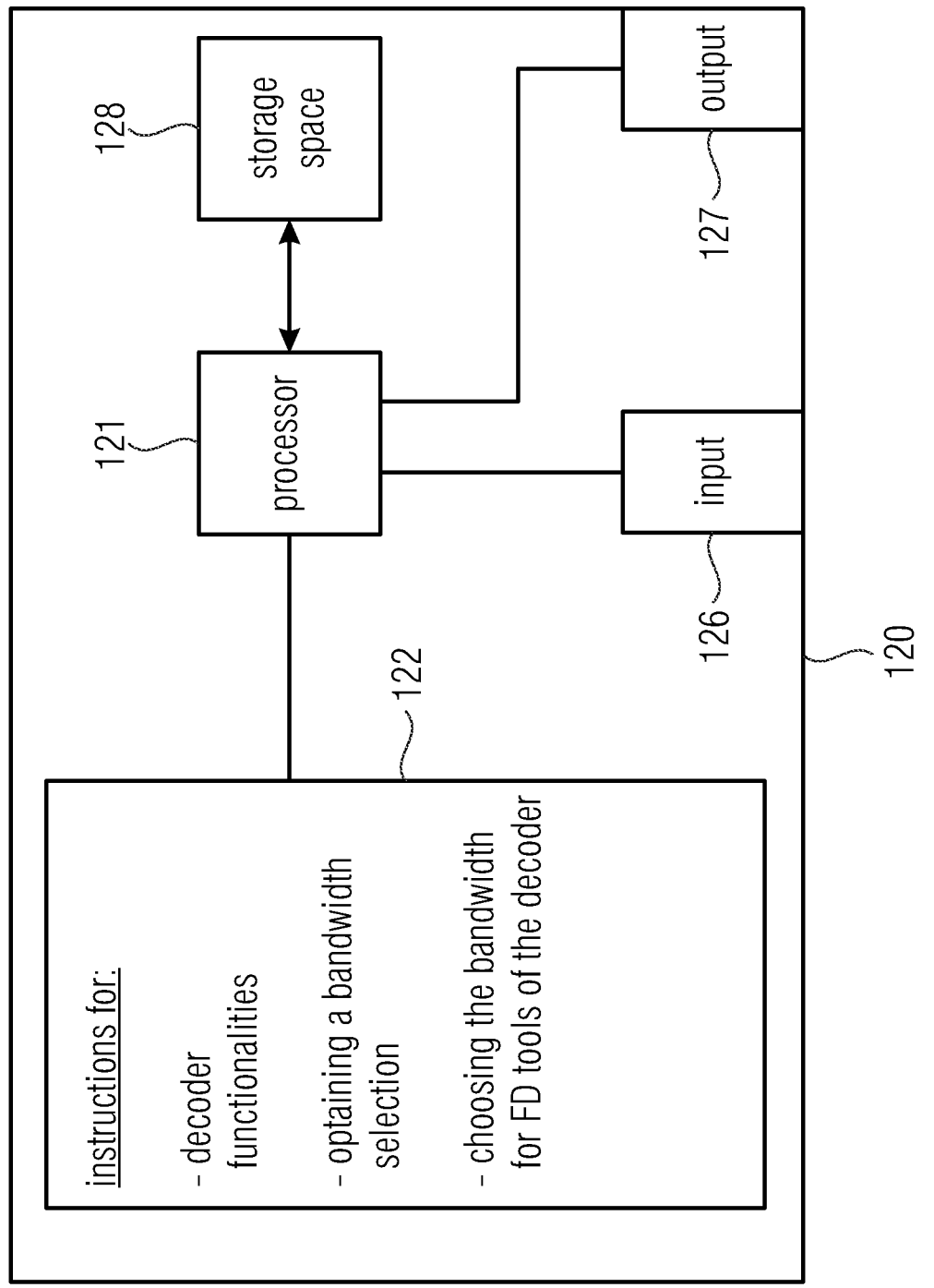

FIG. 8b shows an apparatus 120 which may implement at least some tools of the decoder apparatus 40 or 40a. The apparatus 120 may comprise a processor 121 and a non-transitory memory unit 122 storing instructions which, when executed by the processor 121, may cause the processor 121 to implement at least one of the TD and/or FD tools of the decoder apparatus 40 or 40a. In particular, the instructions may implement a subgroup of FD tools (e.g., TNS and/or noise filling) and other FD tools which are not in the subgroup (e.g., 44, 46, etc.). The instructions may also comprise instructions which, when executed by the processor 121, perform a selection of the bandwidth so that the bandwidth of the signals processed by the tools in the subgroup of FD tools (e.g., TNS and/or noise filling) differs from the bandwidth of the signals processed by the other FD tools which are not in the subgroup (e.g., 44, 46, etc.). The instructions may be such as to control a bandwidth selection based on energy detections associated to the different bandwidths, as, for example, performed by an encoder. The instructions may also comprise instructions which, when executed by the processor 121, permit to operate as a encoder and, in particular, permit to control the bandwidth of a subgroup of FD tools (e.g., 43, 45) which may be different from the bandwidth of other FD tools. The bandwidth chosen for the subgroup at the encoder may be the same chosen for the subgroup at the decoder. The non-transitory memory unit 122 may also comprise other data, such as at least portions electronic versions of Tables 1, 2, and/or 3. The apparatus 120 may comprise a storage space 128 for storing, for example, a bitstream obtained from an information signal (e.g., an audio signal).

The apparatus 120 may comprise an output unit 127 for transmitting data, e.g., wirelessly, e.g., using a particular protocol, such as Bluetooth. The apparatus 120 may also comprise an input unit 126 for obtaining data, e.g., wirelessly, e.g., using a particular protocol, such as Bluetooth. For example, the apparatus 120 may obtain, by executing the instructions stored in the non-transitory memory unit 122, a bitstream transmitted by a decoder.

In examples, the apparatus 110 and 120 may be the same device. In examples, the composition of different apparatus 110 and 120 form a system.

Depending on certain implementation requirements, examples may be implemented in hardware. The implementation may be performed using a digital storage medium, for example a floppy disk, a Digital Versatile Disc (DVD), a Blu-Ray Disc, a Compact Disc (CD), a Read-only Memory (ROM), a Programmable Read-only Memory (PROM), an Erasable and Programmable Read-only Memory (EPROM), an Electrically Erasable Programmable Read-Only Memory (EEPROM) or a flash memory, having electronically readable control signals stored thereon, which cooperate (or are capable of cooperating) with a programmable computer system such that the respective method is performed. Therefore, the digital storage medium may be computer readable.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine readable carrier. In other words, an example of method is, therefore, a computer program having a program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example comprises a processing unit, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An encoder apparatus comprising:
a plurality of frequency domain (FD) encoder tools for encoding an information signal, the information signal presenting a plurality of frames; and
an encoder bandwidth detector and controller configured to select a bandwidth for at least a subgroup of the plurality of FD encoder tools, the subgroup comprising less FD encoder tools than the plurality of FD encoder tools, on a basis of information signal characteristics so that at least one of the FD encoder tools of the subgroup comprises a different bandwidth with respect to at least one of FD encoder tools which are not in the subgroup, wherein at least one FD encoder tool of the subgroup is a temporal noise shaping (TNS) tool, wherein at least one FD encoder tool which is not in the subgroup is connected upstream to the TNS tool and is chosen between a linear predictive coding (LPC) based spectral shaper and a spectral noise shaping (SNS) tool, and wherein the at least one FD encoder tool which is not in the subgroup is configured to operate at a full bandwidth or at a bandwidth broader than the selected bandwidth.

2. The encoder apparatus of claim 1, wherein:
the at least one FD encoder tool of the subgroup is a noise level estimator tool.

3. The encoder apparatus of claim 1, wherein:
the at least one FD encoder tool which is not in the subgroup is chosen between a spectral quantizer and a residual coder.

4. The encoder apparatus of claim 1, wherein:
the encoder bandwidth detector and controller is configured to select a bandwidth of the at least one FD encoder tool of the subgroup between at least a first bandwidth common to the at least one of the FD encoder tools which are not in the subgroup and a second bandwidth different from a bandwidth of the at least one of the FD encoder tools which are not in the subgroup.

5. The encoder apparatus of claim 1, wherein:
the encoder bandwidth detector and controller is configured to select a bandwidth of at least one of the plurality of FD encoder tools on a basis of at least one energy estimation on the information signal.

6. The encoder apparatus of claim 1, wherein:
the encoder bandwidth detector and controller is configured to compare at least one energy estimate associated to a bandwidth of the information signal to a respective threshold to control a bandwidth for at least one of the plurality of FD encoder tools.

7. The encoder apparatus of claim 1, wherein:
the TNS tool is configured to autocorrelate a TNS input signal within a bandwidth chosen by the encoder bandwidth detector and controller.

8. The encoder apparatus of claim 1, wherein the encoder bandwidth detector and controller is configured to select at least one bandwidth which is within the full bandwidth at which the at least one of the FD encoder tools which are not in the subgroup is configured to operate.

9. The encoder apparatus of claim 1, wherein at least one of remaining FD encoder tools of the plurality of FD encoder tools is configured to operate in open chain with respect to a bandwidth chosen by the encoder bandwidth detector and controller.

10. The encoder apparatus of claim 1, wherein:
the encoder bandwidth detector and controller is configured to select a bandwidth among a finite number of bandwidths and/or among a set of pre-defined bandwidths.

11. The encoder apparatus of claim 1, wherein:
the encoder bandwidth detector and controller is configured to perform a selection among at least one or a combination of the following bandwidths: a 4 KHz, 8 KHz, 12 KHz, 16 KHz, and 24 KHz, and/or NB, WB, SSWB, SWB, FB.

12. The encoder apparatus of claim 1, wherein:
the encoder bandwidth detector and controller is configured to control the signalling of the bandwidth to a decoder.

13. The encoder apparatus of claim 1, configured to:
encode a control data field comprising information regarding a chosen bandwidth.

14. The encoder apparatus of claim 1, configured to:
encode a control data field comprising at least one of:
 0 data bits corresponding to NB bandwidth;
 1 data bit corresponding to NB, WB bandwidth;
 2 data bits corresponding to NB, WB, SSWB bandwidth;
 2 data bits corresponding to NB, WB, SSWB, SWB bandwidth; and
 3 data bits corresponding to NB, WB, SSWB, SWB, FB bandwidth.

15. An encoder apparatus comprising:
a plurality of frequency domain (FD) encoder tools for encoding an information signal, the information signal presenting a plurality of frames; and
an encoder bandwidth detector and controller configured to select a bandwidth for at least a subgroup of the plurality of FD encoder tools, the subgroup comprising less FD encoder tools than the plurality of FD encoder tools, on a basis of information signal characteristics so that at least one of the FD encoder tools of the subgroup comprises a different bandwidth with respect to at least one of FD encoder tools which are not in the subgroup,
wherein the encoder bandwidth detector and controller is configured to select a bandwidth of at least one of the plurality of FD encoder tools on a basis of at least one energy estimation on the information signal, and
wherein the at least one energy estimation is performed as:

$$E_B(n) = \sum_{k=I_{f_s}(n)}^{I_{f_s}(n+1)-1} \frac{X(k)^2}{I_{f_s}(n+1) - I_{f_s}(n)} \text{ for } n = 0 \ldots N_B - 1$$

where $X(k)$ are MDCT or MDST or FD coefficients, $N_B$ is the number of bands, and $I_{f_s}(n)$ are indices associated to the bands.

16. An encoder apparatus comprising:
a plurality of frequency domain (FD) encoder tools for encoding an information signal, the information signal presenting a plurality of frames; and
an encoder bandwidth detector and controller configured to select a bandwidth for at least a subgroup of the plurality of FD encoder tools, the subgroup comprising less FD encoder tools than the plurality of FD encoder tools, on a basis of information signal characteristics so that at least one of the FD encoder tools of the subgroup comprises a different bandwidth with respect to at least one of FD encoder tools which are not in the subgroup,
the encoder apparatus further comprising a TNS tool configured to perform a filtering operation comprising a calculation of the filtering operation:

for each $k = 0 \ldots 8$ $$r(k) = \begin{cases} r_0(k), & \text{if } \prod_{s=0}^{2} e(s) = 0 \\ \sum_{s=0}^{2} \frac{\sum_{n=sub\_start(f,s)}^{sub\_stop(f,s)-1-k} X_s(n)X_s(n+k)}{e(s)}, & \text{otherwise} \end{cases}$$

-continued with $$r_0(k) = \begin{cases} 1, & \text{if } k = 0 \\ 0, & \text{otherwise} \end{cases}$$

and $$e(s) = \sum_{n=sub\_start(f,s)}^{sub\_stop(f,s)-1} X_s(n)^2 \text{ for } s = 0 \ldots 2$$

where X(k) are MDCT or MDST or FD coefficients, sub_start(f,s) and sub_stop(f,s) are associated to a particular bandwidth as detected by the encoder bandwidth detector and controller.

17. An encoder apparatus comprising:
a plurality of frequency domain (FD) encoder tools for encoding an information signal, the information signal presenting a plurality of frames; and
an encoder bandwidth detector and controller configured to select a bandwidth for at least a subgroup of the plurality of FD encoder tools, the subgroup comprising less FD encoder tools than the plurality of FD encoder tools, on a basis of information signal characteristics so that at least one of the FD encoder tools of the subgroup comprises a different bandwidth with respect to at least one of FD encoder tools which are not in the subgroup,
the encoder apparatus further comprising a noise estimator configured to estimate a noise level using $$L_{NF} = \frac{\sum_{k=0}^{N_E-1} I_{NF}(k) \cdot \frac{|X_f(k)|}{gg}}{\sum_{k=0}^{N_E-1} I_{NF}(k)}$$

where gg refers to a global gain, $I_{NF}(k)$ refers to an identification of spectral lines on which the noise level is to be estimated, and $X_f(k)$ is a signal.

18. A decoder apparatus comprising a plurality of FD decoder tools for decoding an information signal encoded in a bitstream, wherein:
the plurality of FD decoder tools are divided among:
a subgroup comprising at least one FD decoder tool, the subgroup comprising a temporal noise shape (TNS) decoder; and
remaining FD decoder tools comprising at least one FD decoder tool which includes a spectral noise shaping (SNS) tool, and an MDCT or MDST shaping tool, downstream to the TNS decoder,
wherein the decoder apparatus is configured to control a bandwidth of the at least one FD decoder tool in the subgroup between a first bandwidth common to the remaining FD decoder tools and a second bandwidth different from the first bandwidth, wherein the first bandwidth is a full bandwidth or a bandwidth broader than the second bandwidth.

19. The decoder apparatus of claim 18, further comprising a bandwidth controller configured to:
choose the bandwidth of the at least one FD decoder tool in the subgroup on a basis of bandwidth information in the bitstream.

20. The decoder apparatus of claim 18, wherein:
the subgroup comprises a decoder noise filling tool.

21. The decoder apparatus of claim 18, wherein:
the at least one of the remaining FD decoder tools comprises an MDCT or MDST shaping tool or another shaping tool based on another transformation.

22. The decoder apparatus of claim 18, wherein the remaining FD decoder tools are configured to operate in open chain with respect to a chosen bandwidth.

23. The decoder apparatus of claim 18, further configured to:
choose a bandwidth among a set of pre-defined bandwidths.

24. The decoder apparatus of claim 18, further configured to:
perform a choice among at least one or a combination of:
a 8 KHz, 16 KHz, 24 KHz, 32 KHz, and 48 KHz and/or NB, WB, SSWB, SWB, FB.

25. A decoder apparatus comprising a plurality of FD decoder tools for decoding an information signal encoded in a bitstream, wherein:
the plurality of FD decoder tools are divided:
in a subgroup comprising at least one FD decoder tool; and
in remaining FD decoder tools comprising at least one FD decoder tool,
wherein the decoder apparatus is configured so that at least one of the plurality of FD decoder tools of the subgroup performs signal processing a different bandwidth with respect to at least one of the remaining FD decoder tools of the plurality of FD decoder tools,
the decoder apparatus further comprising a noise filling tool configured to apply a noise level using indices given by $$I_{NF}(k) = \begin{cases} 1 & \text{if } 24 \leq k < bw_{stop} \text{ and} \\ & X_q(i) == 0 \text{ for all } i = k-3 \ldots \min(bw_{stop}, k+3) \\ 0 & \text{otherwise} \end{cases}$$

where $bw_{stop}$ is achieved on a basis of bandwidth information in the bitstream.

26. A decoder apparatus comprising a plurality of FD decoder tools for decoding an information signal encoded in a bitstream, wherein:
the plurality of FD decoder tools are divided:
in a subgroup comprising at least one FD decoder tool; and
in remaining FD decoder tools comprising at least one FD decoder tool,
wherein the decoder apparatus is configured so that at least one of the plurality of FD decoder tools of the subgroup performs signal processing a different bandwidth with respect to at least one of the remaining FD decoder tools of the plurality of FD decoder tools,
the decoder apparatus further comprising a TNS decoder configured to perform:

$s^0(\text{start\_freq}(0)-1) = s^1(\text{start\_freq}(0)-1) = \ldots = s^7(\text{start\_freq}(0)-1) = 0$ for f=0 to num_tns_filters−1 do
  for n=start_freq(f) to stop_freq(t)−1 do $t^K(n) = \widehat{X_f}(n)$ for k=7 to 0 do $t^k(n) = t^{k+1}(n) - rc_q(k)s^k(n-1)$ $s^{k+1}(n) = rc_q(k)t^k(n) + s^k(n-1)$ $\widehat{X_s}(n) = s^0(n) = t^0(n)$ where $\tilde{x}_s(n)$ is an output of the TNS decoder and $\hat{x}_f(n)$ is an input of the TNS decoder, and num_tns_filters, start_freq, stop_freq are achieved on a basis of bandwidth information in the bitstream.

27. A method for encoding an information signal according to at least a plurality of operations in a frequency domain (FD), the method comprising:

selecting a bandwidth for a subgroup of FD operations, the subgroup including a temporal noise shaping (TNS) operation;

performing first signal processing operations at the selected bandwidth for the subgroup of FD operations;

upstream, performing second signal processing operations at a different bandwidth for FD operations which are not in the subgroup, the FD operations which are not in the subgroup including at least one of a linear predictive coding (LPC) based spectral shaping operation and a spectral noise shaping (SNS) operation, wherein the different bandwidth is a full bandwidth or a bandwidth broader than the selected bandwidth.

28. A method for decoding a bitstream with an information signal and control data, the method comprising a plurality of signal processing operations in a frequency domain (FD), the method comprising:

choosing a bandwidth selection for a subgroup of FD operations on a basis of the control data;

performing first signal processing operations at a selected bandwidth for the subgroup of FD operations;

downstream, performing second signal processing operations at a different bandwidth for FD operations which are not in the subgroup, wherein FD operations of the subgroup are at a bandwidth which is a full bandwidth or a broader bandwidth than the selected bandwidth.

* * * * *

UNITED STATES PATENT AND TRADEMARK OFFICE
CERTIFICATE OF CORRECTION

PATENT NO. : 11,462,226 B2
APPLICATION NO. : 16/866280
DATED : October 4, 2022
INVENTOR(S) : Markus Schnell et al.

It is certified that error appears in the above-identified patent and that said Letters Patent is hereby corrected as shown below:

In the Claims

On Column 38, Claim number 26, Line numbers 30 through 35:

" $$I_{NF}(k) = \begin{cases} 1 & \text{if } 24 \leq k < bw_{stop} \text{ and } X_q(i) == 0 \text{ for all } i = k-3 \ldots \min(bw_{stop}, k+3) \\ 0 & \text{otherwise} \end{cases}$$ "

Should read:

-- $$I_{NF}(k) = \begin{cases} 1 & \text{if } 24 \leq k < bw_{stop} \text{ and } \widehat{X_q}(i) == 0 \text{ for all } i = k-3 \ldots \min(bw_{stop}, k+3) \\ 0 & \text{otherwise} \end{cases}$$ --

On Column 38, Claim number 28, Line number 57:
"for n=start_freq(f) to stop_freq(t)-1 do"
Should read:
--for n=start_freq(f) to stop_freq(f)-1 do--

Signed and Sealed this
Thirtieth Day of May, 2023

*Katherine Kelly Vidal*

Katherine Kelly Vidal
*Director of the United States Patent and Trademark Office*